United States Patent
Ohashi et al.

(10) Patent No.: US 12,456,712 B2
(45) Date of Patent: Oct. 28, 2025

(54) SEMICONDUCTOR DEVICE

(71) Applicant: Nuvoton Technology Corporation Japan, Kyoto (JP)

(72) Inventors: Takashi Ohashi, Osaka (JP); Takeshi Imamura, Kyoto (JP); Hiroto Katsuda, Kyoto (JP)

(73) Assignee: NUVOTON TECHNOLOGY CORPORATION JAPAN, Kyoto (JP)

( * ) Notice: Subject to any disclaimer, the term of this patent is extended or adjusted under 35 U.S.C. 154(b) by 0 days.

(21) Appl. No.: 18/923,311

(22) Filed: Oct. 22, 2024

(65) Prior Publication Data

US 2025/0046758 A1 Feb. 6, 2025

Related U.S. Application Data

(63) Continuation of application No. PCT/JP2024/000297, filed on Jan. 10, 2024.
(Continued)

(51) Int. Cl.
*H01L 25/07* (2006.01)
*H01L 23/00* (2006.01)
(Continued)

(52) U.S. Cl.
CPC ............ *H01L 25/072* (2013.01); *H01L 24/29* (2013.01); *H01L 24/32* (2013.01); *H10D 30/668* (2025.01);
(Continued)

(58) Field of Classification Search
CPC ......... H01L 24/16; H01L 24/06; H01L 24/17; H01L 24/81; H01L 23/562;
(Continued)

(56) References Cited

U.S. PATENT DOCUMENTS 4,616,413 A 10/1986 Iliou et al.
10,340,347 B1 * 7/2019 Yoshida .................. H01L 24/16
(Continued)

FOREIGN PATENT DOCUMENTS

| CN | 113035865 A | 6/2021 |
|---|---|---|
| JP | 2020-043164 A | 3/2020 |
| WO | 2018/123799 A1 | 7/2018 |

OTHER PUBLICATIONS

International Search Report dated Apr. 2, 2024 issued in International Patent Application No. PCT/JP2024/000297, with English translation.
(Continued)

*Primary Examiner* — Mouloucoulaye Inoussa
(74) *Attorney, Agent, or Firm* — Rimon P.C.

(57) ABSTRACT

A semiconductor device includes: a semiconductor layer; first and second vertical MOS transistors provided in the semiconductor layer; a metal layer connected to and in contact with an entire surface on a back face side of the semiconductor layer; and a support bonded to a back face side of the metal layer via an adhesive. In a plan view, the support is larger in area than the semiconductor layer and encompasses the semiconductor layer. A thickness of the support is greater than a thickness of the semiconductor layer. In a cross-sectional view, a height of the adhesive along a lateral face of the semiconductor layer does not reach a top face of the semiconductor layer. In the cross-sectional view, a semiconductor chip resulting from excluding the support and the adhesive from the semiconductor device is in a curved shape that projects in a direction toward the support.

9 Claims, 19 Drawing Sheets

Related U.S. Application Data

(60) Provisional application No. 63/440,617, filed on Jan. 23, 2023.

(51) Int. Cl.
  *H10D 30/66* (2025.01)
  *H10D 62/10* (2025.01)
  *H10D 64/23* (2025.01)

(52) U.S. Cl.
  CPC ......... *H10D 62/117* (2025.01); *H10D 62/126* (2025.01); *H10D 64/252* (2025.01); *H01L 2224/2919* (2013.01); *H01L 2224/32058* (2013.01); *H01L 2224/32137* (2013.01); *H01L 2224/32225* (2013.01); *H01L 2924/13091* (2013.01); *H01L 2924/3511* (2013.01)

(58) Field of Classification Search
  CPC ... H01L 2924/3511; H01L 2224/81815; H01L 2224/81192; H01L 2224/0401; H01L 2224/16238; H01L 2224/13007; H01L 2224/0603; H01L 2224/05015; H01L 2224/171; H01L 2224/13014; H01L 2224/0615; H01L 2224/131; H01L 2224/16057; H01L 2924/00014; H01L 2924/014; H01L 2224/05; H01L 2224/16225; H10D 64/252; H10D 30/63; H10D 84/0149; H10D 64/258; H10D 30/668; H10D 89/105; H10D 64/513; H10D 84/83; H10D 84/038; H10D 84/016; H10D 64/62; H10D 62/393; H10D 62/83; H10D 64/251; H10D 84/141; H10D 84/839; H10D 30/645; H10D 30/611

See application file for complete search history.

(56) References Cited

U.S. PATENT DOCUMENTS

| | | | |
|---|---|---|---|
| 2007/0164445 A1* | 7/2007 | Ejima | H01L 24/13 257/E21.503 |
| 2010/0109151 A1* | 5/2010 | Fujimura | H01L 23/49833 257/701 |
| 2017/0271236 A1* | 9/2017 | Uezato | H01L 21/4882 |
| 2018/0092611 A1* | 4/2018 | Krämer | A61B 6/0478 |
| 2019/0157183 A1* | 5/2019 | Kai | H01L 21/4803 |
| 2019/0319126 A1* | 10/2019 | Matsushima | H01L 23/3114 |
| 2019/0378810 A1* | 12/2019 | Yoshioka | H01L 23/4334 |
| 2020/0083367 A1 | 3/2020 | Kojima | |
| 2020/0365729 A1* | 11/2020 | Okawa | H10D 84/038 |
| 2020/0373270 A1 | 11/2020 | Joo et al. | |
| 2020/0395454 A1* | 12/2020 | Hamasaki | H10D 84/038 |
| 2020/0395479 A1* | 12/2020 | Fujioka | H10D 30/478 |
| 2021/0104629 A1 | 4/2021 | Fujioka et al. | |
| 2021/0288154 A1* | 9/2021 | Tanaka | H10D 64/62 |
| 2022/0085192 A1* | 3/2022 | Tanaka | H10D 84/038 |
| 2022/0093787 A1* | 3/2022 | Kojima | H10D 30/6728 |
| 2022/0278018 A1* | 9/2022 | Sato | H01L 23/3735 |

OTHER PUBLICATIONS

International Search Report dated Apr. 2, 2024 issued in International Patent Application No. PCT/JP2024/000300, with English translation.
Decision to Grant a Patent dated Nov. 19, 2024 issued in the corresponding Japanese Patent Application No. 2024-560409, with English translation.
Notice of Reasons for Refusal dated Nov. 19, 2024 issued in the corresponding Japanese Patent Application No. 2024-559092, with English translation.
Decision to Grant a Patent dated Mar. 4, 2025 issued in the corresponding Japanese Patent Application No. 2024-559092, with English translation.
Office Action issued in the corresponding Chinese Patent Application No. 202480002317.0, dated on Jun. 18, 2025, with the English Search report.
Office Action dated Apr. 3, 2025 issued in the corresponding Chinese Patent Application No. 202480002316.6, with English translation.

\* cited by examiner

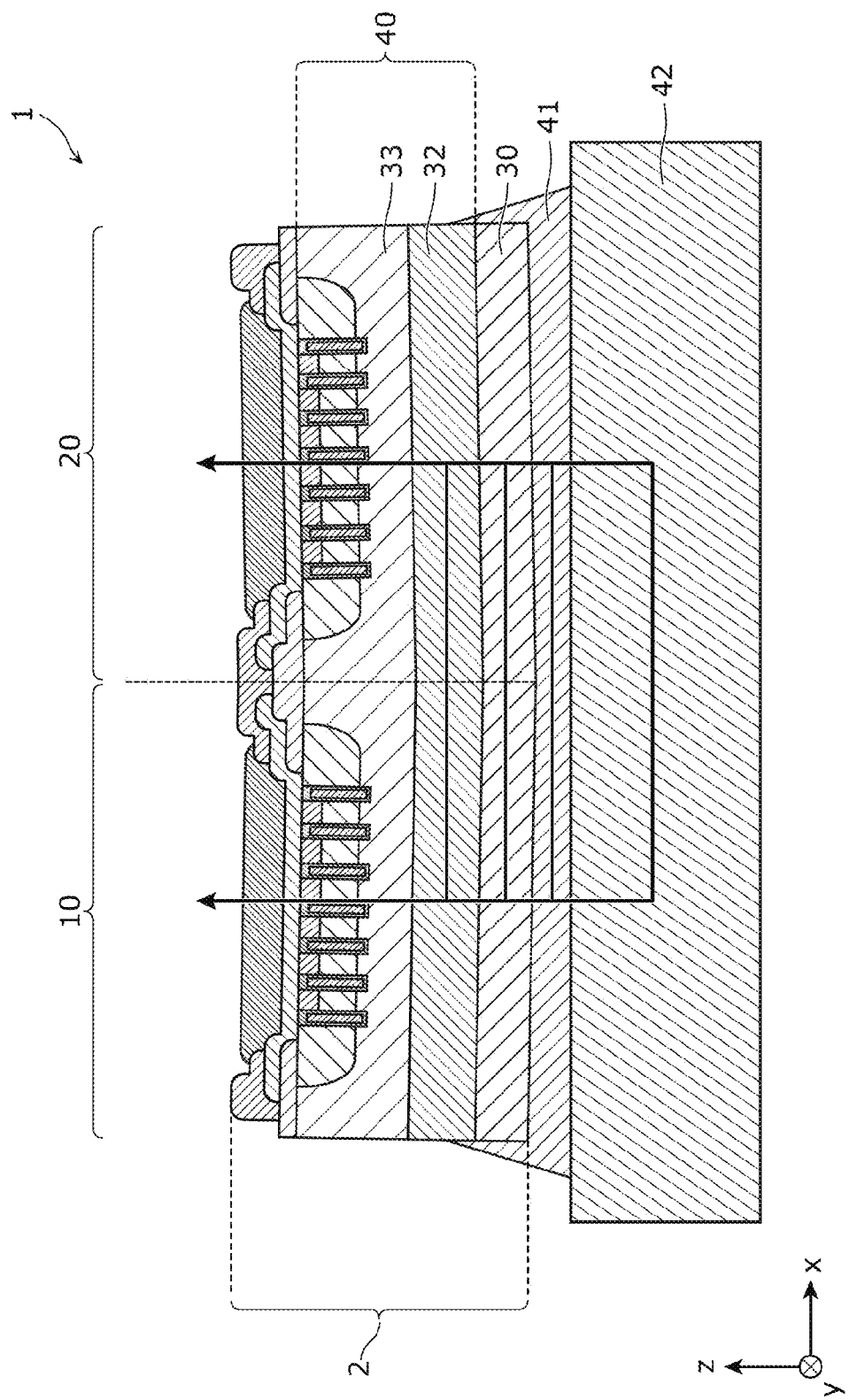

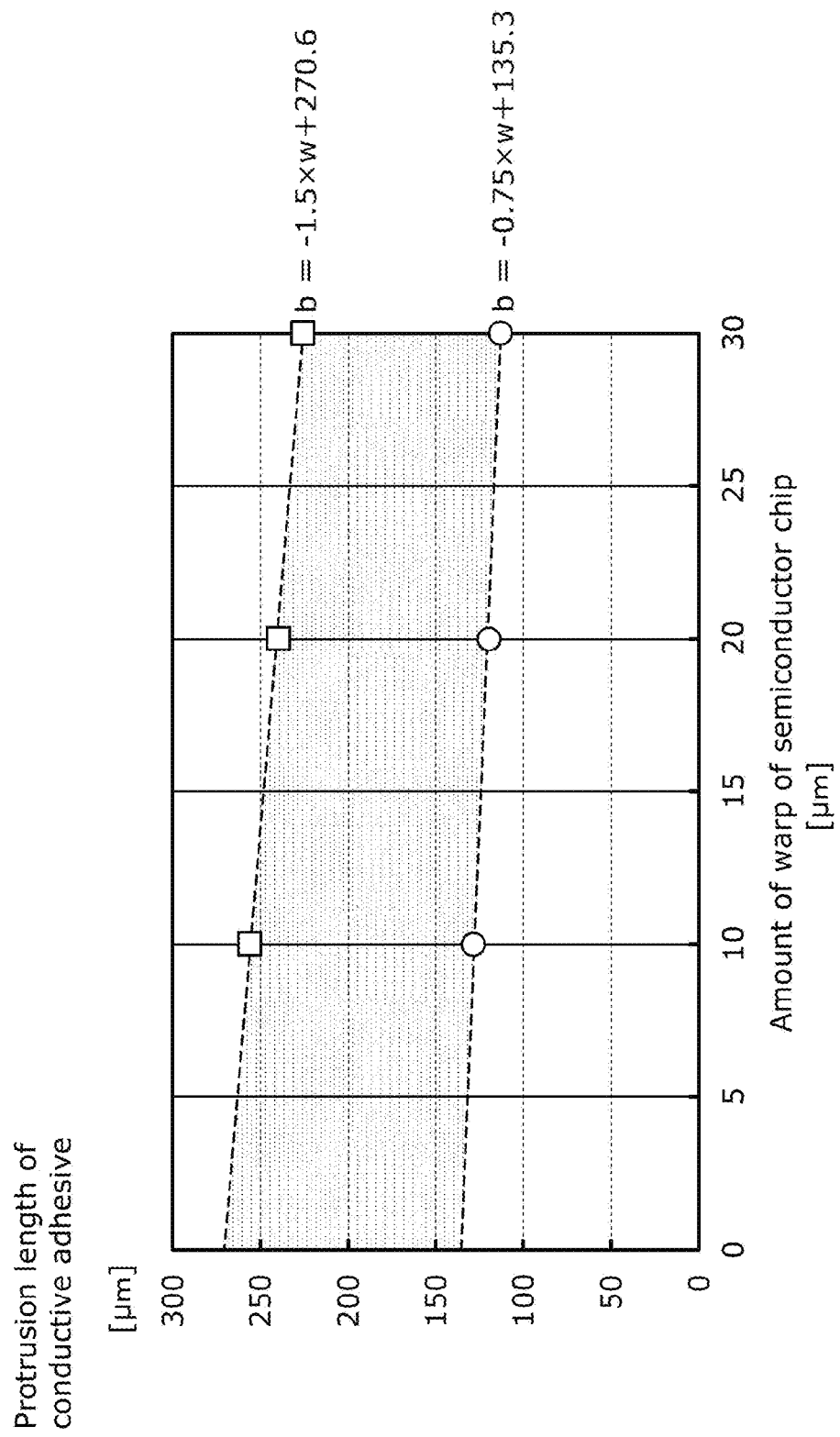

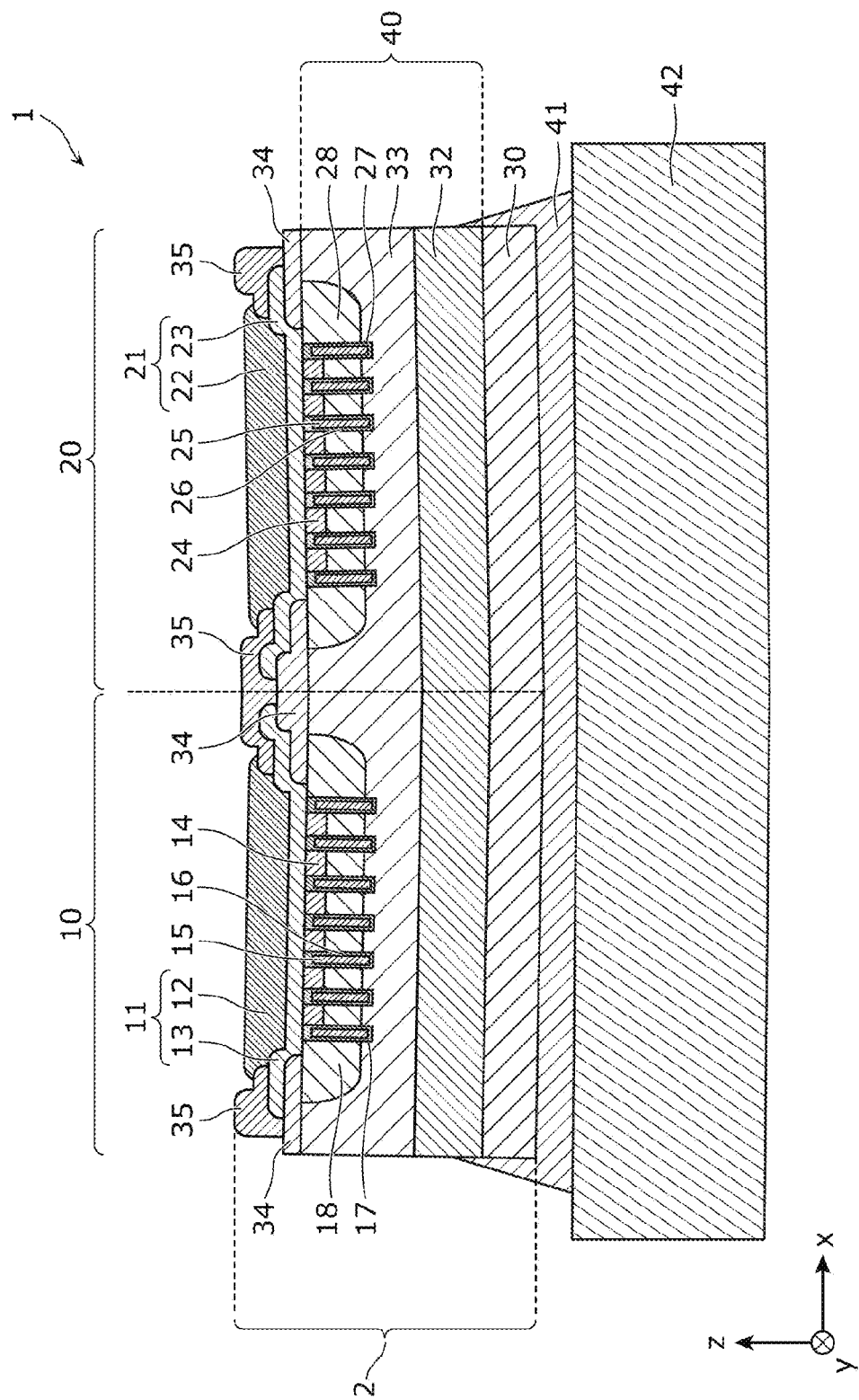

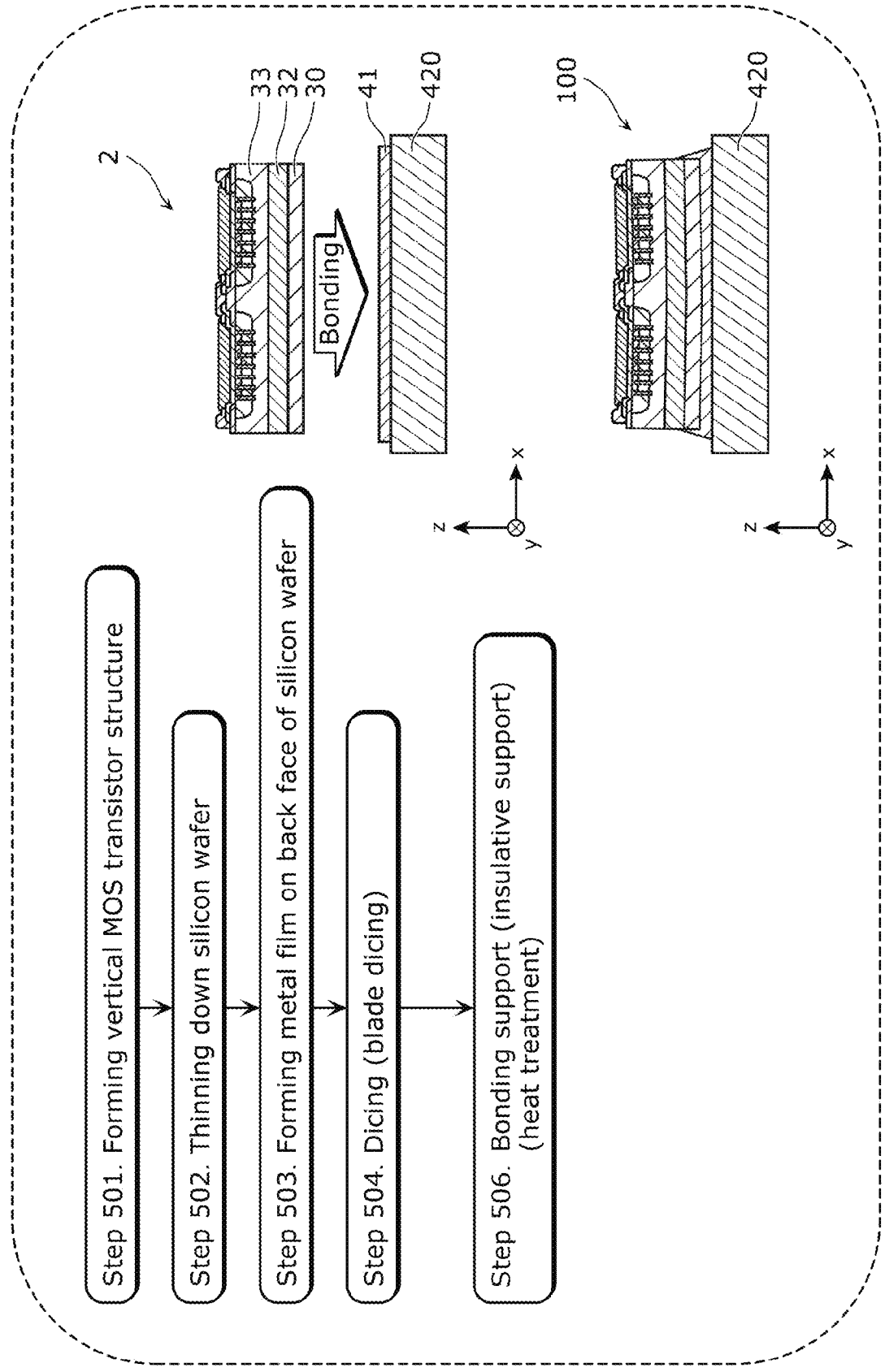

SEMICONDUCTOR DEVICE

CROSS REFERENCE TO RELATED APPLICATIONS

This is a continuation application of PCT International Application No. PCT/JP2024/000297 filed on Jan. 10, 2024, designating the United States of America, which is based on and claims priority of U.S. Patent Application No. 63/440,617 filed on Jan. 23, 2023. The entire disclosures of the above-identified applications, including the specifications, drawings and claims are incorporated herein by reference in their entirety.

FIELD

The present disclosure relates to a semiconductor device.

BACKGROUND

A vertical metal-oxide semiconductor (MOS) transistor in a dual configuration that is capable of controlling bidirectional conduction using one chip has been used for the purpose of protecting a lithium-ion battery from at least one of overcharge or overdischarge.

CITATION LIST

Patent Literature

PTL 1: U.S. Pat. No. 4,616,413

SUMMARY

Technical Problem

In order to reduce the on resistance of a vertical MOS transistor in a dual configuration (hereinafter also referred to as a "semiconductor chip"), the vertical MOS transistor in the dual configuration may include a structure that has a large area in a plan view and in which a semiconductor substrate is thin. However, such a structure causes a warp of the semiconductor chip to increase, and the strength of the semiconductor chip to decrease. Patent Literature (PTL) 1 discloses a structure in which a printed circuit board is bonded to a rigid metal plate via a conductive adhesive.

In view of the above, the present disclosure has an object to provide a semiconductor device that includes a vertical MOS transistor in a dual configuration that is capable of reducing, in a structure in which a rigid metal plate is bonded via a conductive adhesive, the area of the rigid metal plate in a plan view as much as possible.

Solution to Problem

In order to solve the above problem, a semiconductor device that is a facedown mountable semiconductor device, the semiconductor device comprising: a semiconductor substrate; a low-concentration impurity layer that is provided on a front face side of the semiconductor substrate; a first vertical metal-oxide semiconductor (MOS) transistor that is provided in a first region of a semiconductor layer that is a combination of the semiconductor substrate and the low-concentration impurity layer; a second vertical MOS transistor that is provided in a second region adjacent to the first region in a plan view of the semiconductor layer; a metal layer that is connected to and in contact with an entire surface on a back face side of the semiconductor substrate; and a support that is bonded to a back face side of the metal layer via an adhesive, wherein in the plan view, the support is larger in area than the semiconductor layer and encompasses the semiconductor layer, a thickness of the support is greater than a thickness of the semiconductor layer, in a cross-sectional view of the semiconductor device that includes a center of the semiconductor layer and an outer periphery of the semiconductor layer in the plan view, a height of the adhesive along a lateral face of the semiconductor layer does not reach a top face of the semiconductor layer, and when a semiconductor chip of the semiconductor device excluding the support and the adhesive is seen in the cross-sectional view, the semiconductor chip is in a curved shape that projects in a direction toward the support.

The above configuration allows a vertical MOS transistor in a dual configuration to mitigate a warp of a semiconductor chip while reducing on resistance, and increase the strength of the semiconductor chip.

Advantageous Effects

The present disclosure has an object to provide a semiconductor device that includes a vertical MOS transistor in a dual configuration that mitigates a warp of a semiconductor chip while reducing the on resistance of the semiconductor chip, and further increases the strength of the semiconductor chip.

BRIEF DESCRIPTION OF DRAWINGS

These and other advantages and features will become apparent from the following description thereof taken in conjunction with the accompanying Drawings, by way of non-limiting examples of embodiments disclosed herein.

FIG. 2B is a schematic cross-sectional view illustrating a principal current flowing through the semiconductor device according to Embodiment 1.

FIG. 7 is a graph showing a relation between the amount of a warp of a semiconductor chip according to Embodiment 1 and the length of the base of a fillet of a conductive adhesive.

FIG. 10B is a schematic cross-sectional view illustrating an example of a structure of a semiconductor device according to Variation 2 of Embodiment 1.

FIG. 12 is a flow chart illustrating parts of a manufacturing process for the semiconductor device according to Embodiment 2.

DESCRIPTION OF EMBODIMENTS

Hereinafter, specific examples of a semiconductor device according to one aspect of the present disclosure are described with reference to the drawings. Each of the embodiments described below shows a specific example of the present disclosure. Therefore, numerical values, shapes, constituent elements, and the arrangement and connection of the constituent elements shown in the embodiments below are mere examples, and are not intended to limit the scope of the present disclosure. Moreover, the respective figures are schematic diagrams and are not necessarily precise illustrations. In the respective figures, substantially identical constituent elements are given the same reference signs, and overlapping descriptions are omitted or simplified.

Embodiment 1

[1. Structure of Semiconductor Device]

Figure 1:
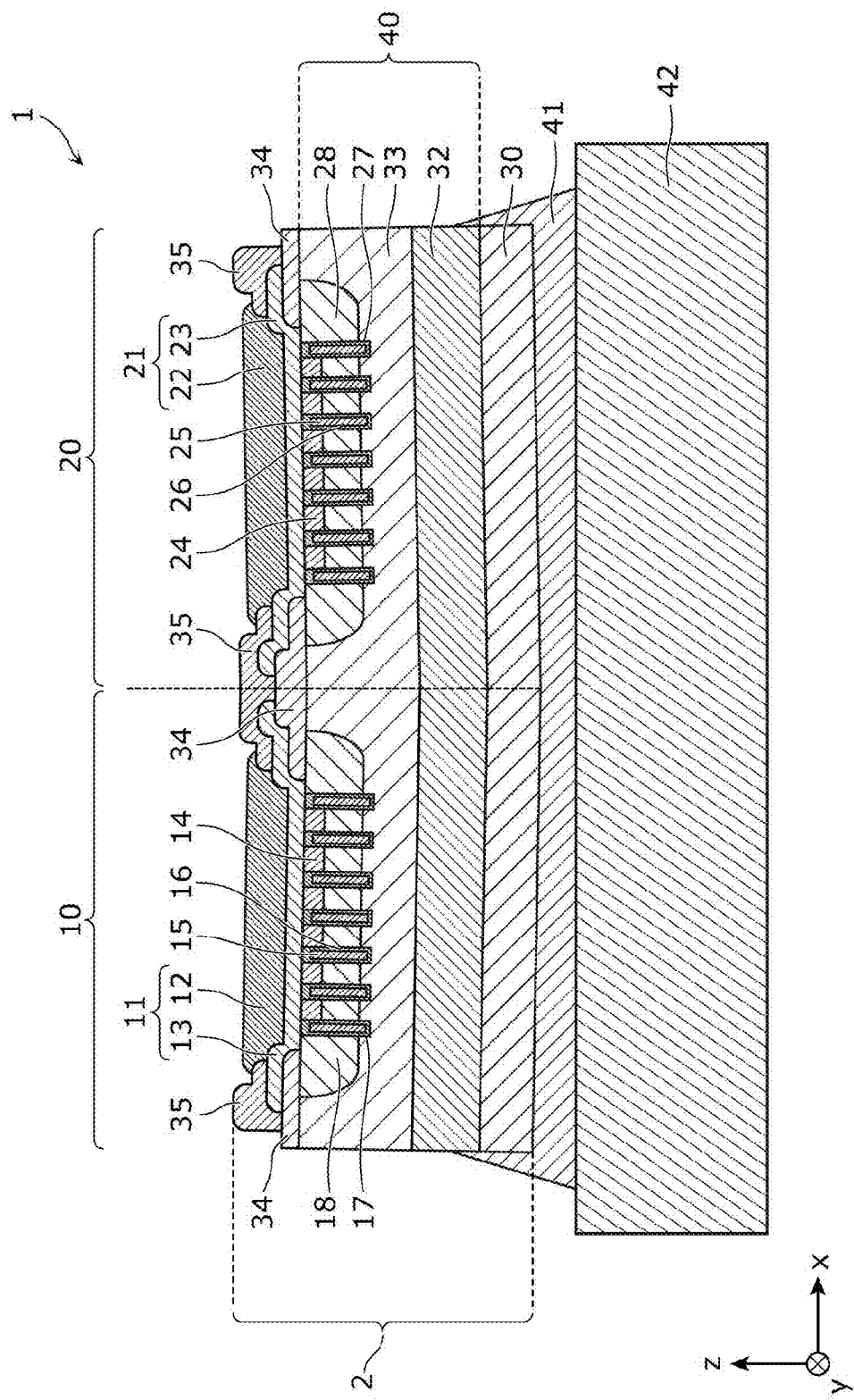
FIG. 1 is a schematic cross-sectional view illustrating an example of a structure of a semiconductor device according to Embodiment 1.
Figure 2A:
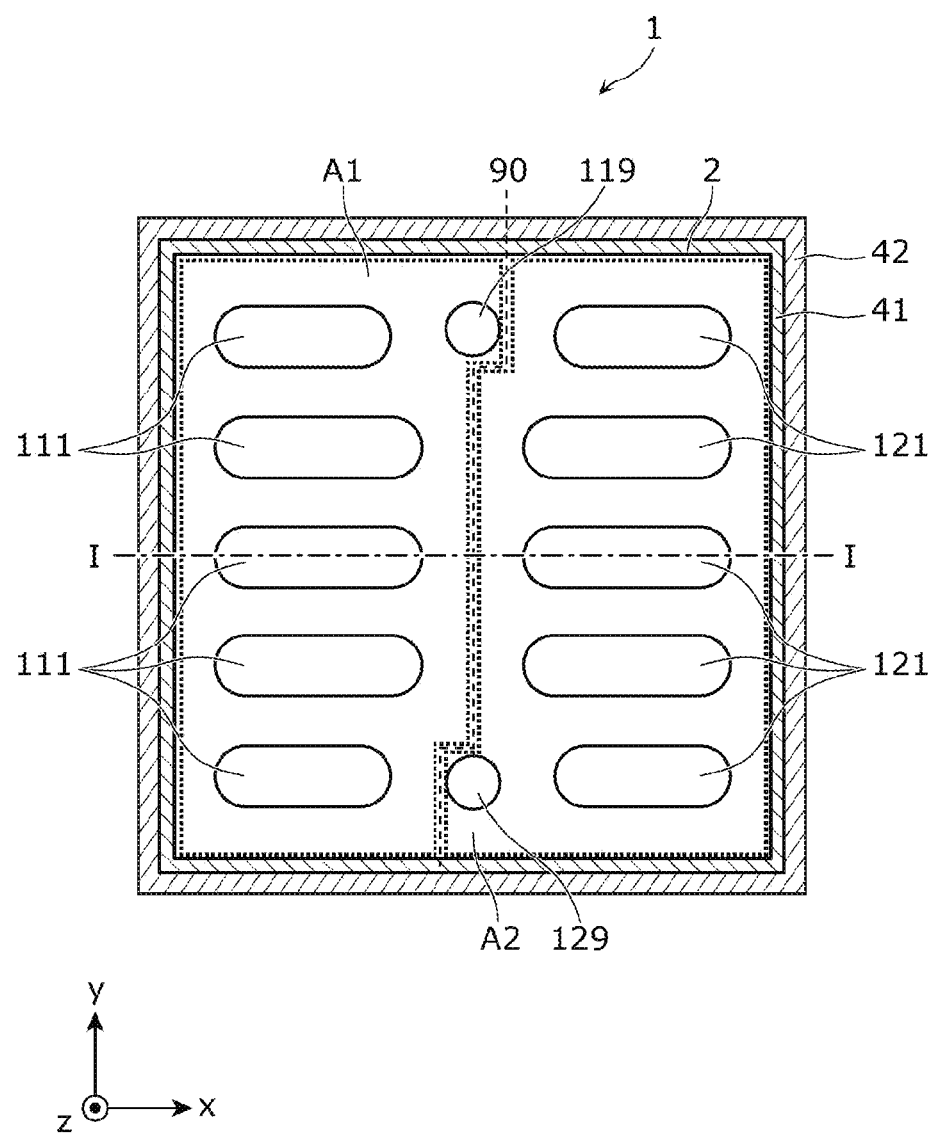
FIG. 2A is a schematic plan view illustrating the example of the structure of the semiconductor device according to Embodiment 1.

FIG. 1 is a schematic cross-sectional view illustrating an example of a structure of a semiconductor device. FIG. 2A is a plan view of the structure. The size and shape of the semiconductor device are an example, except that the semiconductor device is in a rectangular shape (a square or a rectangle). Moreover, the size, shape, and arrangement of pads are also an example. FIG. 2B is a cross-sectional view schematically illustrating a principal current flowing through the semiconductor device. FIG. 1 and FIG. 2B are a cross section taken along line I-I shown in FIG. 2A.

As shown in FIG. 1 and FIG. 2B, semiconductor device 1 includes semiconductor substrate 32, metal layer 30, and low-concentration impurity layer 33 provided on semiconductor substrate 32. In the present disclosure, a combination of semiconductor substrate 32 and low-concentration impurity layer 33 is referred to as semiconductor layer 40.

Semiconductor substrate 32 is disposed on a back face side of semiconductor layer 40 and comprises silicon of a first conductivity type that contains impurities of the first conductivity type. Low-concentration impurity layer 33 is disposed on a front face side of semiconductor layer 40, is provided in contact with semiconductor substrate 32, contains impurities of the first conductivity type that have a concentration lower than the concentration of the impurities of the first conductivity type of semiconductor substrate 32, and is of the first conductivity type. Low-concentration impurity layer 33 may be provided on semiconductor substrate 32 by, for example, epitaxial growth.

As shown in FIG. 1 and FIG. 2A, semiconductor device 1 includes: first vertical metal-oxide semiconductor (MOS) transistor 10 (hereinafter also referred to as "transistor 10") provided in first region A1 in semiconductor layer 40; and second vertical MOS transistor 20 (hereinafter also referred to as "transistor 20") provided in second region A2 in semiconductor layer 40.

Here, as shown in FIG. 2A, first region A1 and second region A2 are adjacent to each other in a plan view of semiconductor layer 40, and divide semiconductor layer 40 into equal areas. In FIG. 2A, a dashed line indicates virtual boundary line 90 between first region A1 and second region A2. (For the sake of clarity, the dashed line indicating boundary line 90 extends to the outside of semiconductor layer 40 and semiconductor device 1.) It should be noted that, in FIG. 2A, although the dashed line indicating first region A1 and second region A2 is not caused to coincide strictly with semiconductor layer 40 and boundary line 90 for the sake of clarity, and is indicated inside with a slight space left, the outer periphery of first region A1 and the outer periphery of second region A2 substantially coincide with the outer periphery of semiconductor layer 40 and boundary line 90.

Metal layer 30 is provided on the back face side of semiconductor layer 40 (semiconductor substrate 32) and comprises, for example, silver (Ag) or copper (Cu). It should be noted that metal layer 30 may include a trace amount of a chemical element other than metal mixed in as impurities in a manufacturing process for a metal material. Moreover, metal layer 30 may be provided on the entire surface on the back face side of semiconductor layer 40 (semiconductor substrate 32), and may have a thickness of at least 10 [μm].

Support 42 is provided in indirect contact with a back face side of metal layer 30 via adhesive 41. Support 42 typically has a thickness at least twice as much as the thickness of semiconductor layer 40, and is, for example, a flat metal plate that has a uniform in-plane thickness of 200 [μm]. Hereinafter, support 42 may be referred to as thick metal plate 42. Thick metal plate 42 may have a conductivity approximately equal to the conductivity of metal layer 30. For example, thick metal plate 42 may have a conductivity of at least 30×10$^6$ [S/m] at 20[° C.] and typically comprise a metal material including copper (Cu) for the most part. Furthermore, adhesive 41 is conductive, is typically silver paste, and may be hereinafter referred to as conductive adhesive 41.

As shown in FIG. 1, in the present disclosure, a structure obtained by excluding support 42 and adhesive 41 from semiconductor device 1 is referred to as semiconductor chip 2. As shown in FIG. 1, semiconductor chip 2 is in a curved shape that projects in a direction toward support 42. The curved shape refers to, for example, a shape formed due to a warp. The amount of a warp of semiconductor chip 2 is a difference between the highest position and the lowest position in the Z direction in a top face or a bottom face of semiconductor layer 40 or in a bottom face of metal layer 30, in a cross-sectional view of semiconductor chip 2. When a warp that occurs in semiconductor chip 2 is a warp that projects in the direction toward support 42, the highest position is the outer periphery of semiconductor layer 40, especially the corner portions of semiconductor layer 40 in the plan view, and the lowest position is the center of semiconductor layer 40 in the plan view.

It should be noted that the center of semiconductor layer 40 in the plan view refers to an intersection point of the diagonal lines of semiconductor layer 40 in the plan view. Moreover, a cross-sectional view of semiconductor device 1 in the present disclosure refers to when a cross section of semiconductor device 1 is seen along a plane including the center of semiconductor layer 40 in semiconductor chip 2 in the plan view and the outer periphery of semiconductor layer 40 in semiconductor chip 2 in the plan view. Here, the outer periphery of semiconductor layer 40 may be any position in the outer periphery of semiconductor layer 40.

As shown in FIG. 1 and FIG. 2A, first body region 18 that contains impurities of a second conductivity type different form the first conductivity type is provided in first region A1 of semiconductor layer 40 (low-concentration impurity layer 33). First source region 14 that contains impurities of the first conductivity type, first gate conductor 15, and first gate insulating film 16 are provided in first body region 18.

First gate insulating film 16 is provided inside each of a plurality of first gate trenches 17 that penetrate through first source region 14 and first body region 18 from the top face of semiconductor layer 40 to a depth that reaches a portion of low-concentration impurity layer 33. First gate conductor 15 is provided on first gate insulating film 16 inside each of the plurality of first gate trenches 17. First gate conductor 15 is an embedded gate electrode that is embedded inside semiconductor layer 40, and is electrically connected to first gate pad 119.

First source electrode 11 includes portion 12 and portion 13. Portion 12 is connected to first source region 14 and first body region 18 via portion 13. Portion 12 of first source electrode 11 is a layer joined with solder at the time of reflow in facedown mounting, and may comprise, as a non-limiting example, a metal material including at least one of nickel, titanium, tungsten, or palladium. The surface of portion 12 may be plated with gold etc.

Portion 13 of first source electrode 11 is a layer that connects portion 12 and semiconductor layer 40, and may comprise, as a non-limiting example, a metal material including at least one of aluminum, copper, gold, or silver.

A thickness of first source electrode 11, including the total thickness of portion 12 and portion 13, is, for example, at least 2 [μm] and at most 8 [μm].

Second body region 28 that contains impurities of the second conductivity type is provided in second region A2 of low-concentration impurity layer 33. Second source region 24 that contains impurities of the first conductivity type, second gate conductor 25, and second gate insulating film 26 are provided in second body region 28.

Second gate insulating film 26 is provided inside each of a plurality of second gate trenches 27 that penetrate through second source region 24 and second body region 28 from the top face of semiconductor layer 40 to a depth that reaches a portion of low-concentration impurity layer 33. Second gate conductor 25 is provided on second gate insulating film 26 inside each of the plurality of second gate trenches 27. Second gate conductor 25 is an embedded gate electrode that is embedded inside semiconductor layer 40, and is electrically connected to second gate pad 129.

Second source electrode 21 includes portion 22 and portion 23. Portion 22 is connected to second source region 24 and second body region 28 via portion 23. Portion 22 of second source electrode 21 is a layer joined with solder at the time of reflow in facedown mounting, and may comprise, as a non-limiting example, a metal material including at least one of nickel, titanium, tungsten, or palladium. The surface of portion 22 may be plated with gold etc.

Portion 23 of second source electrode 21 is a layer that connects portion 22 and semiconductor layer 40, and may comprise, as a non-limiting example, a metal material including at least one of aluminum, copper, gold, or silver.

A thickness of second source electrode 21, including the total thickness of portion 22 and portion 23, is, for example, at least 2 [μm] and at most 8 [μm].

The above-described configuration of transistors 10 and 20 allows semiconductor substrate 32 to serve as a common drain region having a first drain region of transistor 10 and a second drain region of transistor 20 in common. A portion of low-concentration impurity layer 33 on a side adjacent to semiconductor substrate 32 may sometimes serve as the common drain region. It should be noted that low-concentration impurity layer 33 is also a common drift layer of transistors 10 and 20, and may be referred to as drift layer 33 in the Specification.

Moreover, metal layer 30 serves as a common drain electrode having a drain electrode of transistor 10 and a drain electrode of transistor 20 in common. When adhesive 41 is silver paste and support 42 is a thick metal plate, not only metal layer 30 but also conductive adhesive 41 and thick metal plate 42 serve as the common drain electrode.

As shown in FIG. 1, first body region 18 and first source region 14 are covered with interlayer insulating layer 34 having openings, and portion 13 of first source electrode 11 is connected to first body region 18 and first source region 14 via the openings of interlayer insulating layer 34. Interlayer insulating layer 34 and portion 13 of first source electrode 11 are covered with passivation layer 35 having openings, and portion 12 of first source electrode 11 is connected to portion 13 of first source electrode 11 via the openings of passivation layer 35.

Second body region 28 and second source region 24 are covered with interlayer insulating layer 34 having openings, and portion 23 of second source electrode 21 is connected to second body region 28 and second source region 24 via the openings of interlayer insulating layer 34. Interlayer insulating layer 34 and portion 23 of second source electrode 21 are covered with passivation layer 35 having openings, and portion 22 of second source electrode 21 is connected to portion 23 of second source electrode 21 via the openings of passivation layer 35.

Accordingly, a plurality of first source pads 111 refer to a region in which first source electrode 11 is partially exposed to the surface of semiconductor device 1, that is, a terminal portion; and a plurality of second source pads 121 refer to a region in which second source electrode 21 is partially exposed to the surface of semiconductor device 1, that is, a terminal portion. Similarly, one or more first gate pads 119 refer to a region in which first gate electrode 19 (not shown in FIG. 1, FIG. 2A, FIG. 2B) is partially exposed to the surface of semiconductor device 1, that is, a terminal portion; and one or more second gate pads 129 refer to a region in which second gate electrode 29 (not shown in FIG. 1, FIG. 2A, FIG. 2B) is partially exposed to the surface of semiconductor device 1, that is, a terminal portion.

In the present disclosure, it is assumed that, in the plan view, first region A1 includes only components constituting first vertical MOS transistor 10, and second region A2 includes only components constituting second vertical MOS transistor 20. Moreover, border line 90 may be viewed as a virtual line tracing the central position of a space between portion 13 of first source electrode 11 and portion 23 of second source electrode 21. Furthermore, border line 90 may be viewed as the space itself having a limited width (even when border line 90 is the space, the space can be recognized as a line by appearance to the naked eye or with low magnification).

In semiconductor device 1, for example, assuming that the first conductivity type is N-type and the second conductivity type is P-type, first source region 14, second source region 24, semiconductor substrate 32, and low-concentration impurity layer 33 may be N-type semiconductors, and first body region 18 and second body region 28 may be P-type semiconductors.

Moreover, in semiconductor device 1, for example, assuming that the first conductivity type is P-type and the second conductivity type is N-type, first source region 14, second source region 24, semiconductor substrate 32, and low-concentration impurity layer 33 may be P-type semiconductors, and first body region 18 and second body region 28 may be N-type semiconductors.

[2. Operation of Vertical MOS Transistor in Dual Configuration]

The following describes a conducting operation of semiconductor device 1, assuming transistors 10 and 20 are what is called N-channel type transistors with the first conductivity type being the N type and the second conductivity type being the P type.

Figure 3A:
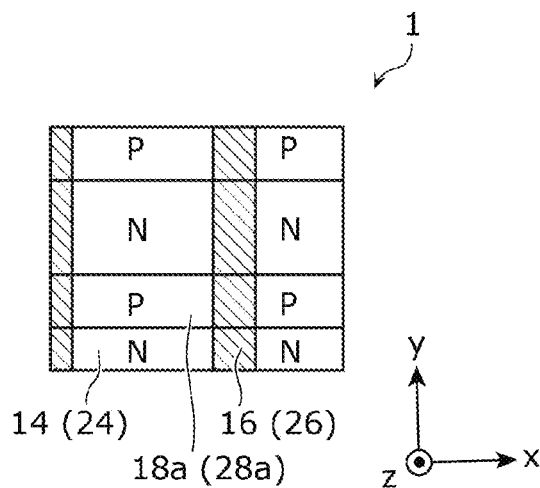
FIG. 3A is a schematic plan view illustrating an example of a structure of the semiconductor device according to Embodiment 1.
Figure 3B:
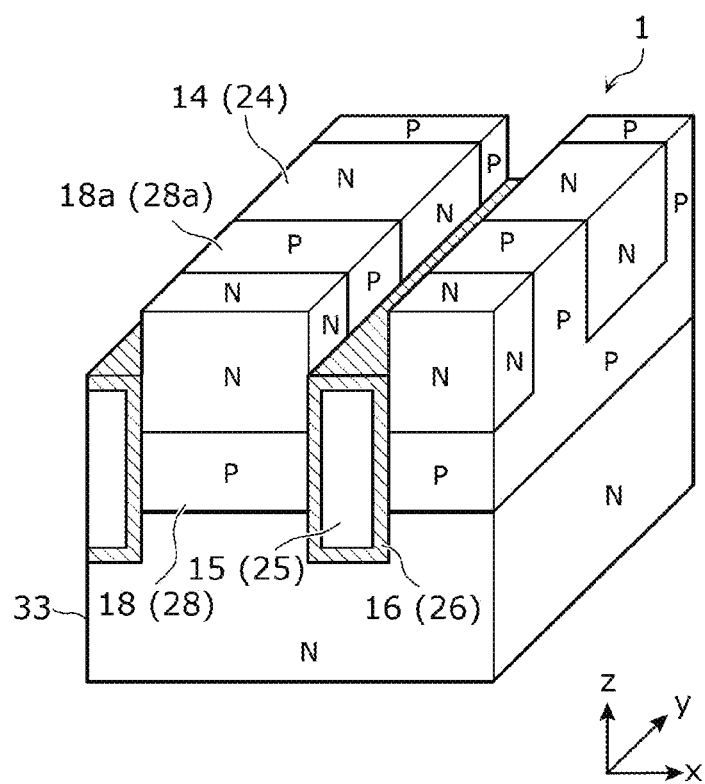
FIG. 3B is a schematic perspective view illustrating an example of the structure of the semiconductor device according to Embodiment 1.

FIG. 3A and FIG. 3B are a plan view and a perspective view of an approximate single unit configuration of transistor 10 (or transistor 20) that is repeatedly formed in an X direction and a Y direction of semiconductor device 1, respectively. For the sake of clarity, neither FIG. 3A nor FIG. 3B illustrates semiconductor substrate 32, metal layer 30, conductive adhesive 41, thick metal plate 42, passivation layer 35, first source electrode 11 (or second source electrode 21), and interlayer insulating layer 34.

Transistor 10 contains the same structure as transistor 20. For this reason, hereinafter, an approximate single unit configuration is described using reference signs for transistor 10.

The Y direction is a direction that is parallel to the top face of semiconductor layer 40 and in which first gate trench 17 extends. The X direction is a direction that is parallel to the top face of semiconductor layer 40 and orthogonal to the Y direction. A Z direction is a direction that is orthogonal to both the X direction and the Y direction and indicates a height direction of semiconductor device 1. In the present disclosure, the Y direction, the X direction, and the Z direction may be referred to as a first direction, a second direction, and a third direction, respectively.

As shown in FIG. 3A and FIG. 3B, transistor 10 includes first connector 18a that electrically connects first body region 18 and first source electrode 11. First connector 18a is a region of first body region 18 in which first source region 14 is not provided, and contains the same impurities of the second conductivity type as those of first body region 18. First source region 14 and first connector 18a are alternately and periodically disposed in the Y direction. The same applies to transistor 20.

In semiconductor device 1, when a high voltage and a low voltage are applied to first source electrode 11 and second source electrode 21, respectively, and a voltage higher than or equal to a threshold value is applied to second gate electrode 29 (second gate conductor 25) with respect to second source electrode 21, a conducting channel is formed in the vicinity of second gate insulating film 26 in second body region 28. As a result, a principal current flows in a pathway from first source electrode 11 to first connector 18a to first body region 18 to low-concentration impurity layer 33 to semiconductor substrate 32 to metal layer 30 to conductive adhesive 41 to thick metal plate 42 to conductive adhesive 41 to metal layer 30 to semiconductor substrate 32 to low-concentration impurity layer 33 to the conducting channel formed in second body region 28 to second source region 24 to second source electrode 21, and semiconductor device 1 becomes conductive. A PN junction is in a contact surface between second body region 28 and low-concentration impurity layer 33 in this conductive pathway and serves as a body diode.

Likewise, in semiconductor device 1, when a high voltage and a low voltage are applied to second source electrode 21 and first source electrode 11, respectively, and a voltage higher than or equal to a threshold value is applied to first gate electrode 19 (first gate conductor 15) with respect to first source electrode 11, a conducting channel is formed in the vicinity of first gate insulating film 16 in first body region 18. As a result, a principal current flows in a pathway from second source electrode 21 to second connector 28a to second body region 28 to low-concentration impurity layer 33 to semiconductor substrate 32 to metal layer 30 to conductive adhesive 41 to thick metal plate 42 to conductive adhesive 41 to metal layer 30 to semiconductor substrate 32 to low-concentration impurity layer 33 to the conducting channel formed in first body region 18 to first source region 14 to first source electrode 11, and semiconductor device 1 becomes conductive. A PN junction is in a contact surface between first body region 18 and low-concentration impurity layer 33 in this conductive pathway and serves as a body diode.

In FIG. 2B, the flow of a bidirectional principal current is schematically indicated by arrows. The flow of the principal current in the horizontal direction (X direction) occurs in each of metal layer 30, conductive adhesive 41, thick metal plate 42, and semiconductor substrate 32. Since metal layer 30 and thick metal plate 42 have a resistivity lower than those of the other layers, it is possible to reduce the on resistance of semiconductor device 1, by thickening metal layer 30 or thick metal plate 42 and increasing the cross-sectional area of a principal current pathway.

[3. Method for Manufacturing Semiconductor Device]

A method for manufacturing semiconductor device 1 is described below.

Figure 4A:
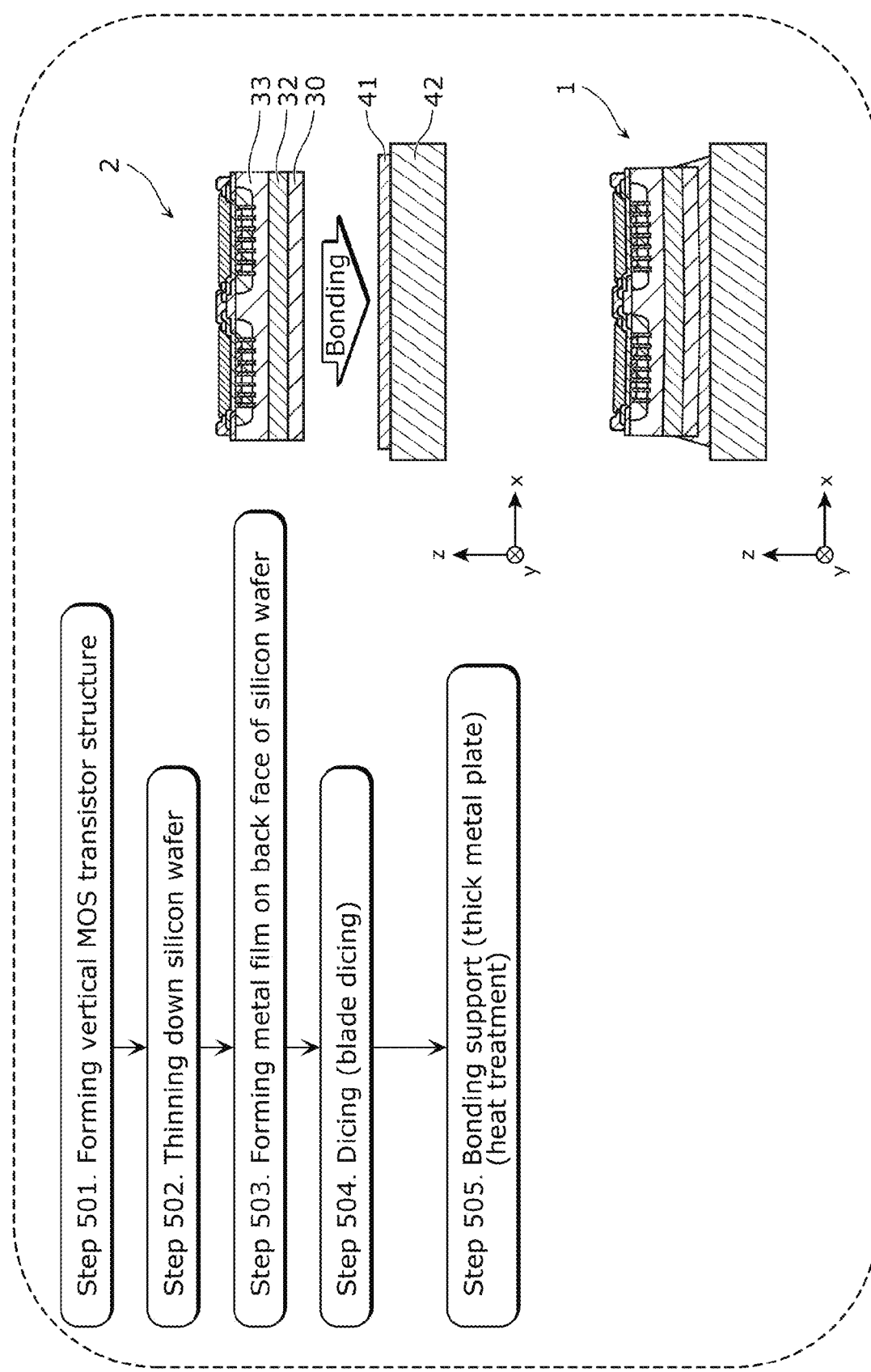
FIG. 4A is a flow chart illustrating parts of a manufacturing process for the semiconductor device according to Embodiment 1.

FIG. 4A shows parts of a manufacturing process for semiconductor device 1 according to Embodiment 1 in a simplified manner. A structure of each vertical MOS transistor in a dual configuration that is to be diced later is formed in a grid shape on a silicon wafer in step 501.

Next, in step 502, a back face side of the silicon wafer (equivalent to semiconductor substrate 32 in each of vertical MOS transistors in a dual configuration to be diced later) is thinned down. In the thinning down in step 502, the thickness of semiconductor layer 40 may be controlled to be at least 15 [μm] and at most 100 [μm], and specifically the thickness of semiconductor layer 40 may be controlled to be at least 15 [μm] and at most 75 [μm].

Then, in step 503, metal layer 30 is formed on an entire surface on the back face side of the silicon wafer that has been thinned down. Although metal layer 30 may include a multilayer configuration that includes, for example, a plurality of metal layers, a face of metal layer 30 that is to be connected to and to be in contact with conductive adhesive 41 in next step 504 may contain silver (Ag) or copper (Cu) as a main material. The plurality of metal layers may be individually formed by any of vapor deposition, sputtering, and plating. In the metal layer formation in step 503, the thickness of metal layer 30 may be at least 10 [μm].

After that, in step 504, each vertical MOS transistor in the dual configuration is diced by performing dicing on the silicon wafer using a blade. Since the diced vertical MOS transistor in the dual configuration is in a state in which thick metal plate 42 is not bonded yet, the vertical MOS transistor can still be referred to as semiconductor chip 2 described earlier.

Although metal layer 30 that has been formed on the back face side of the silicon wafer in step 503 is cut together with the silicon wafer in step 504, metal layer 30 that is physically pushed out by the blade extends along lateral faces of semiconductor chip 2. For this reason, a protrusion (what is called a burr) that extends downward to a back face side of semiconductor chip 2 (−Z direction) is formed in the outer periphery of metal layer 30 of diced semiconductor chip 2

It should be noted that the dicing using the blade is an example, and dicing of the vertical MOS transistor in the dual configuration may be performed by a method other than blade dicing such as dicing using a laser. However, a protrusion is less likely to be formed in the dicing using the laser.

Finally, in step 505, thick metal plate 42 to which conductive adhesive 41 such as silver paste has been applied in advance is prepared, and is bonded to the back face side of metal layer 30 of semiconductor chip 2. Normally, conductive adhesive 41 is applied to a front face side of thick metal plate 42, according to the amount of push on conductive adhesive 41 being pushed into, for example, between 5 [μm] and 10 [μm], and the thickness of conductive adhesive 41 after curing and bonding is calculated to be a target value (e.g., between 20 [μm] and 60 [μm]).

Conductive adhesive 41 is an adhesive for bonding the back face side of metal layer 30 and thick metal plate 42. The entire surface on the back face side of metal layer 30 may be evenly covered with conductive adhesive 41 in a state in which thick metal plate 42 is bonded after curing of conductive adhesive 41.

Thick metal plate 42 having an area larger than that of semiconductor substrate 32 in the plan view is selected. In bonding, alignment is performed to provide a margin having a substantially equal width from the outer periphery of metal layer 30 to the outer periphery of thick metal plate 42 closest to metal layer 30 in the plan view. As shown in FIG. 2A, as an example, thick metal plate 42 is in a shape similar to the shape of semiconductor layer 40. Semiconductor layer 40 and thick metal plate 42 being in a similar shape means that semiconductor layer 40 and thick metal plate 42 are in the same shape and differ only in area.

Moreover, when thick metal plate 42 is what is called a flat plate whose in-plane thickness is broadly uniform and that has no steps or asperities, such thick metal plate 42 is conducive to bonding of semiconductor layer 40. In Embodiment 1, thick metal plate 42 is assumed as a flat plate.

Generally, at the time of bonding, semiconductor chip 2 having a relatively small area is fitted to thick metal plate 42 having a relatively large area as a receiving end. Conductive adhesive 41 may protrude from the back face of metal layer 30 in the plan view. The amount of protrusion of conductive adhesive 41 may be or need not be uniform along the outer periphery of semiconductor layer 40 in the plan view. FIG. 2A shows, as an example, a case in which the protrusion of conductive adhesive 41 is uniform. Additionally, part of protruding conductive adhesive 41 rises along the lateral faces of semiconductor chip 2 as shown in FIG. 1, and forms a fillet in a substantially triangular shape.

In step 505, to cause conductive adhesive 41 such as silver paste to cure, thick metal plate 42 is treated with heat at high temperatures in a state in which semiconductor chip 2 is fitted to thick metal plate 42. The temperature in heat treatment may be at most 200[° C.], and is, for example, 170[° C.]. Conductive adhesive 41 starts to cure at around 170[° C.], and metal layer 30 and thick metal plate 42 are bonded to be semiconductor device 1.

It should be noted that at the time of the heat treatment that heats thick metal plate 42 to 170[° C.], a warp occurs in semiconductor chip 2. As stated above, the thickness of semiconductor layer 40 may be at least 15 [μm] and at most 75 [μm], and the thickness of each of first source electrode 11 and second source electrode 21 may be at least 2 [μm] and at most 8 [μm]. The thickness of metal layer 30 may be at least 10 [μm]. In this thickness configuration, a warp that projects in a direction toward thick metal plate 42 (−Z direction in the cross-sectional view in FIG. 1) occurs in semiconductor chip 2 at 170[° C.].

Figure 4B:
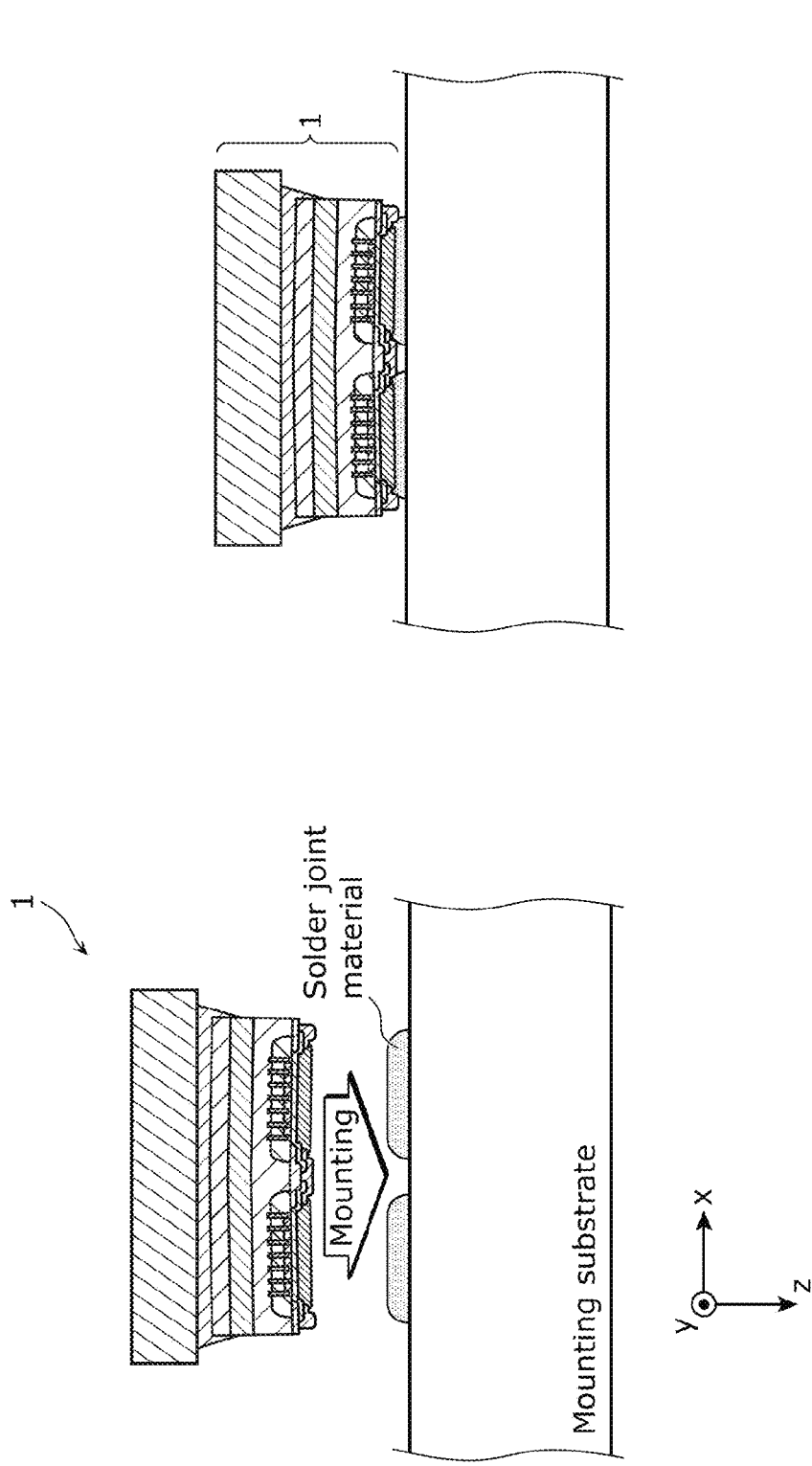
FIG. 4B is a schematic cross-sectional view illustrating a step of facedown mounting the semiconductor device according to Embodiment 1.

FIG. 4B is a schematic diagram when semiconductor device 1 is facedown mounted.

[4. Discussion]

The following describes advantageous effects achieved by semiconductor device 1 according to Embodiment 1.

In a vertical MOS transistor in a dual configuration, to reduce on resistance at the time of conduction, it is required to thin down semiconductor substrate 32 (semiconductor layer 40) and thicken metal layer 30. A warp that projects in the −Z direction at high temperatures is likely to occur in semiconductor chip 2 in such a configuration. The more semiconductor layer 40 is thinned down and the more metal layer 30 is thickened, the larger the warp that occurs at high temperatures becomes.

In particular, when the vertical MOS transistor in the dual configuration that has a low on resistance is required, for the purpose of increasing a total gate width of a channel, it is effective to increase the area of semiconductor chip 2 in a plan view. However, when the area is large, the warp that occurs in semiconductor chip 2 increases remarkably.

When semiconductor chip 2 is facedown mounted on a mounting substrate, it is necessary to perform reflow that heats semiconductor chip 2 to approximately 240[° C.] using a solder joint material. When the amount of a warp of semiconductor chip 2 at 240[° C.] exceeds 40 [μm], it is known that a mounting failure is likely to occur regardless of a direction of the warp, and it is required to reduce the amount of the warp of semiconductor chip 2 to be less than 40 [μm].

In semiconductor device 1 according to Embodiment 1, since semiconductor chip 2 is bonded to thick metal plate 42 at around 170[° C.] lower than 240[° C.], it is possible to set the amount of a warp of semiconductor chip 2 approximately to the amount of a warp that occurs at around 170[° C.]. When a material that does not remelt such as silver paste is selected as conductive adhesive 41, as shown in FIG. 4B, the warp of semiconductor chip 2 already bonded to thick metal plate 42 does not increase in reflow (240[° C.]) when semiconductor device 1 is facedown mounted on the mounting substrate.

Accordingly, the configuration of semiconductor device 1 according to Embodiment 1 is especially effective for a structure that increases the amount of a warp as semiconductor chip 2, that is, semiconductor chip 2 in which semiconductor layer 40 is thin, whose area in the plan view is large, and further in which metal layer 30 is thick. Moreover, since thick metal plate 42 serves as a support for semiconductor chip 2 when thick metal plate 42 is sufficiently thick, it is possible to compensate for a decrease in strength of semiconductor chip 2 caused by thinning down semiconductor layer 40.

However, in semiconductor device 1 according to Embodiment 1, when semiconductor chip 2 is bonded to thick metal plate 42 via conductive adhesive 41, as schematically shown in FIG. 1, conductive adhesive 41 that has protruded from semiconductor chip 2 partially rises to the lateral faces of semiconductor chip 2 and forms a fillet in a substantially triangular shape in the cross-sectional view. For this reason, in the plan view, when the area of thick metal plate 42 is not sufficiently large compared to the area of semiconductor layer 40, there are concerns regarding the protrusion of conductive adhesive 41 not remaining within thick metal plate 42.

Additionally, in the cross-sectional view, since semiconductor device 1 is likely to short-circuit when protruded conductive adhesive 41 rises to the top face of semiconductor chip 2, a height (the height of the fillet of conductive adhesive 41) to which conductive adhesive 41 rises from the front face of thick metal plate 42 along the lateral faces of semiconductor chip 2 needs to be less than the top face of semiconductor layer 40.

Accordingly, for semiconductor device 1 according to Embodiment 1, it is necessary to (1) prepare the area of thick metal plate 42 considering the protrusion of conductive adhesive 41 in the plan view, as much as the length of the base of the fillet of conductive adhesive 41, and (2) adjust the thickness of semiconductor chip 2 considering the rise of conductive adhesive 41, as much as the height of the fillet of conductive adhesive 41.

By controlling a curve of semiconductor chip 2, semiconductor device 1 according to Embodiment 1 makes it possible to define an appropriate size of thick metal plate 42 in the plan view, with regard to above (1), and prevent semiconductor chip 2 from short-circuiting due to the protrusion (fillet) of conductive adhesive 41, with regard to above (2).

First, the following describes (1).

As stated above, in semiconductor device 1 according to Embodiment 1, thick metal plate 42 needs to have a size that enables thick metal plate 42 to encompass semiconductor chip 2 and conductive adhesive 41 protruding from semiconductor chip 2 in the plan view. For this reason, it is inevitable that the area of semiconductor device 1 is caused to be larger than the area of semiconductor chip 2 in the plan view, because semiconductor chip 2 is bonded to thick metal plate 42.

In order to prevent the area of semiconductor device 1 from being larger than the area of semiconductor chip 2 as much as possible in the plan view, it is necessary to control the area of thick metal plate 42 to be as small as possible. For this purpose, it is important to reduce a protrusion length of conductive adhesive 41.

In view of the above, in semiconductor device 1 according to Embodiment 1, the thickness of metal layer 30 is set to be at least 10 [μm], and the warp of semiconductor chip 2 at 170[° C.] is controlled to project in the direction toward support 42 (−Z direction).

As shown in FIG. 1, when the back face of metal layer 30 warps to project in the direction toward support 42 (−Z direction) as seen from thick metal plate 42, the warp causes the outer periphery of semiconductor chip 2 to curve in a direction relatively away from support 42 (+Z direction). Since a push on conductive adhesive 41 is reduced in the outer periphery of semiconductor chip 2 when semiconductor chip 2 is in such a curved shape, it is possible to achieve the effect of reducing a protruding length of conductive adhesive 41 from semiconductor chip 2.

Accordingly, when semiconductor chip 2 of semiconductor device 1 excluding thick metal plate 42 and conductive adhesive 41 is seen in the cross-sectional view of semiconductor device 1, semiconductor chip 2 may be in a curved shape that projects in the direction toward thick metal plate 42. In other words, a thickness of conductive adhesive 41 immediately below semiconductor layer 40 in the outer periphery of semiconductor layer 40 in the plan view may be greater than a thickness of conductive adhesive 41 immediately below semiconductor layer 40 at the center of semiconductor layer 40 in the plan view.

Figure 5A:
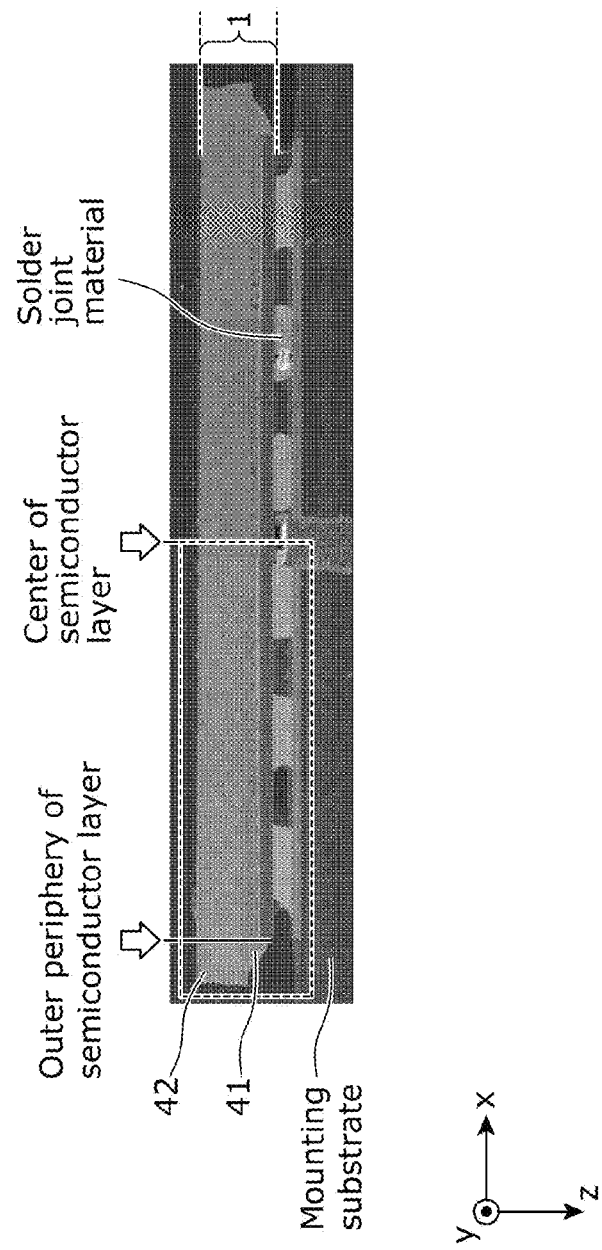
FIG. 5A is a cross-sectional SEM image showing an example of a structure of the semiconductor device according to Embodiment 1.
Figure 5B:
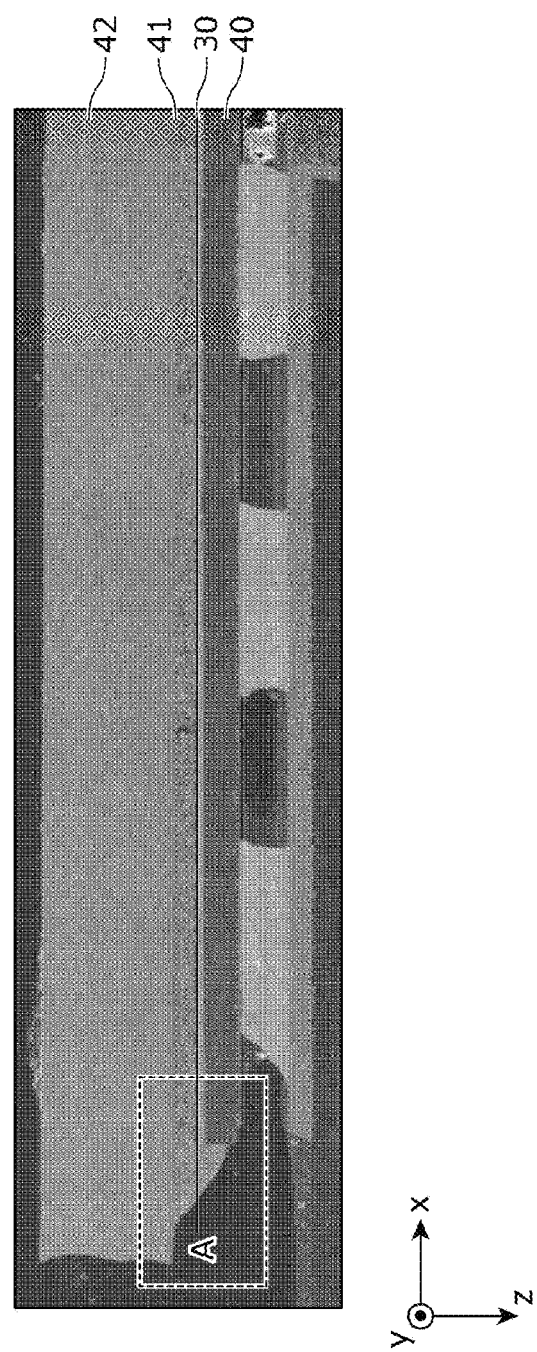
FIG. 5B is a cross-sectional SEM image showing an example of the structure of the semiconductor device according to Embodiment 1.
Figure 5C:
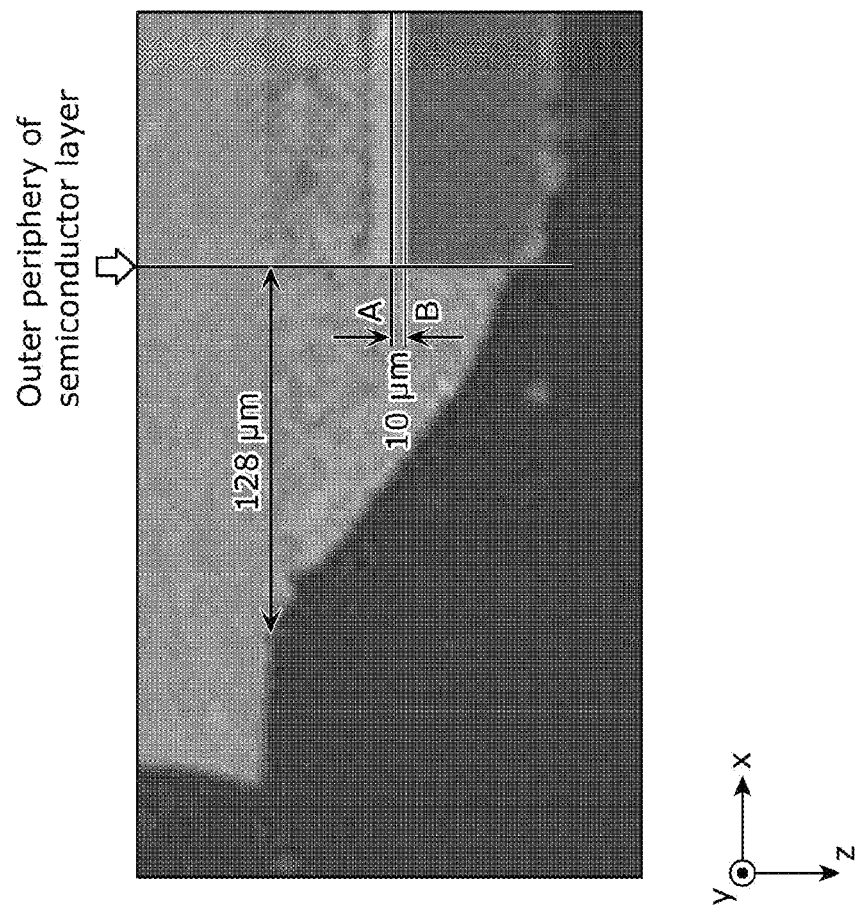
FIG. 5C is a cross-sectional SEM image showing an example of the structure of the semiconductor device according to Embodiment 1.

FIG. 5A, FIG. 5B, and FIG. 5C each show a cross-sectional SEM image when semiconductor device 1 according to Embodiment 1 is facedown mounted on the mounting substrate. FIG. 5B is an enlarged cross-sectional SEM image of the portion surrounded by the dashed line in FIG. 5A, and FIG. 5C is an enlarged cross-sectional SEM image of the portion surrounded by the dashed line in FIG. 5B. In semiconductor device 1 shown in FIG. 5A, FIG. 5B, and FIG. 5C, the thickness of semiconductor layer 40 is 53 [μm], the thickness of each of first source electrode 11 and second source electrode 21 is 4 [μm], the thickness of metal layer 30 is 10 [μm], and the thickness of thick metal plate 42 is 200 [μm].

Horizontal line A in FIG. 5B and FIG. 5C shows the position of an interface between semiconductor layer 40 and metal layer 30 at the center of semiconductor layer 40 in the plan view, up to the outer periphery of semiconductor layer 40 in the plan view. Moreover, horizontal line B in FIG. 5C shows the position of an interface between semiconductor layer 40 and metal layer 30 in the outer periphery of semiconductor layer 40 in the plan view.

In FIG. 5C, horizontal line A is on a side closer to thick metal plate 42 (−Z direction) than horizontal line B is, and a distance between horizontal line A and horizontal line B in the Z direction is 10 [μm]. Accordingly, semiconductor chip 2 is in a warped shape that projects in the direction toward thick metal layer 42 (−Z direction), and the amount of the warp is 10 [μm].

As shown in FIG. 5C, when the amount of the warp of semiconductor chip 2 is 10 [μm], the protrusion length of conductive adhesive 41 (the length of the base of a fillet of conductive adhesive 41) is 128 [μm], and thick metal plate 42 needs to have a margin of at least 128 [μm] from the outer periphery of semiconductor chip 2.

Figure 6A:
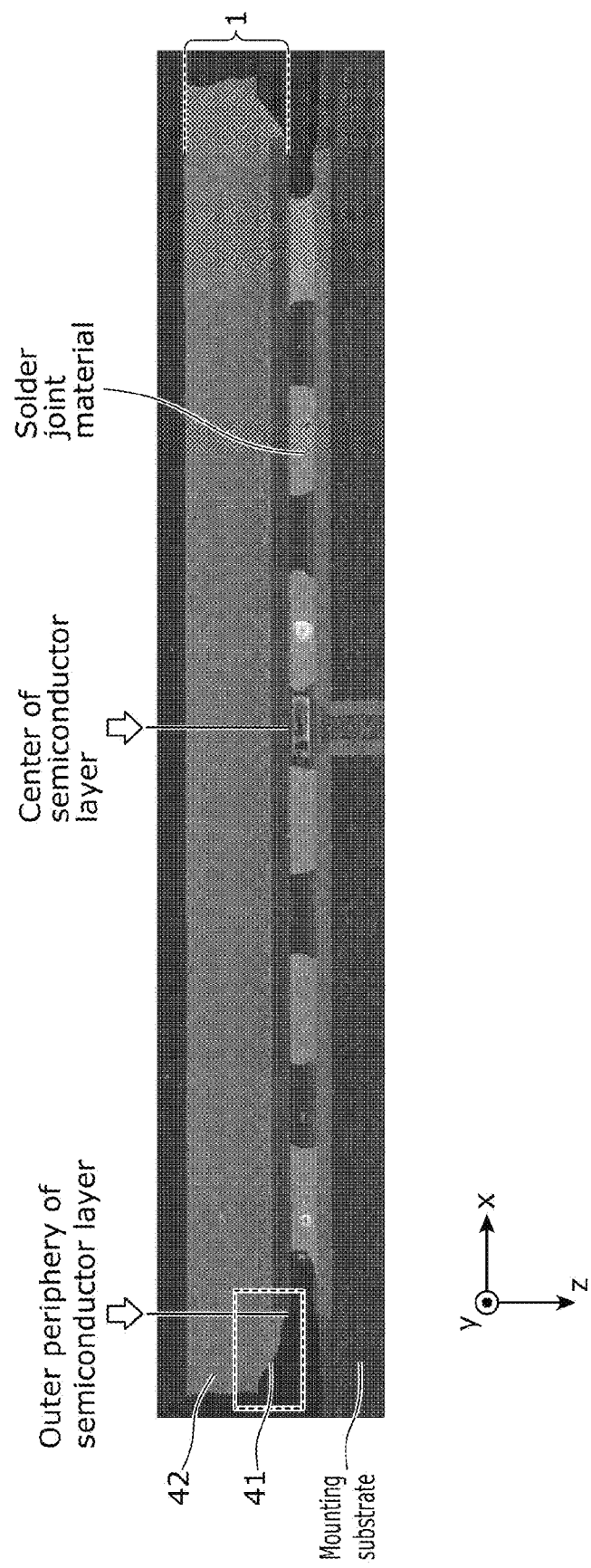
FIG. 6A is a cross-sectional SEM image showing an example of a structure of a semiconductor device according to Comparative Example 1 for Embodiment 1.
Figure 6B:
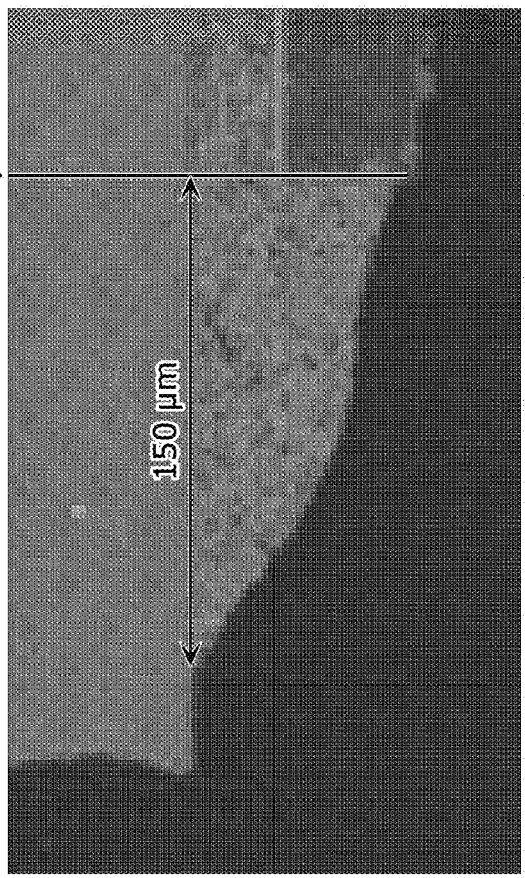
FIG. 6B is a cross-sectional SEM image showing an example of the structure of the semiconductor device according to Comparative Example 1 for Embodiment 1.

FIG. 6A and FIG. 6B each show a cross-sectional SEM image in Comparative Example 1 for Embodiment 1. FIG. 6B is an enlarged cross-sectional SEM image of the portion surrounded by the dashed line in FIG. 6A. In semiconductor device 1 shown in FIG. 6A and FIG. 6B, the thickness of semiconductor layer 40 is 53 [μm], the thicknesses of first source electrode 11 and second source electrode 21 are 4 [μm], the thickness of metal layer 30 is 3 [μm], and the thickness of thick metal plate 42 is 200 [μm]. In this thickness configuration, semiconductor chip 2 is in a warped shape that projects in the direction away from thick metal plate 42 (+Z direction), and the amount of the warp is 2 [μm].

As shown in FIG. 6B, when semiconductor chip 2 warps by 2 [μm] in the +Z direction, the protrusion length of conductive adhesive 41 (the length of the base of a fillet of conductive adhesive 41) is 150 [μm], and in semiconductor device 1 according to Embodiment 1, it is clear that the protrusion length is greater than 128 [μm], that is, the length of the base of the fillet of conductive adhesive 41 formed when semiconductor chip 2 warps by 10 [μm] in the −Z direction.

To put it another way, since a push on conductive adhesive 41 is reduced in the outer periphery of semiconductor chip 2 by semiconductor chip 2 warping to project in the −Z direction, it is possible to achieve the effect of reducing a protruding length of conductive adhesive 41 from semiconductor chip 2 in the plan view. In view of this, for the purpose of defining an appropriate size of thick metal plate 42, the inventors considered a relation between the amount of a warp of semiconductor chip 2 and the protrusion length of conductive adhesive 41 (the length of the base of a fillet of conductive adhesive 41) in semiconductor device 1 according to Embodiment 1.

FIG. 7 is a graph showing a relation between the length of the base of a fillet of conductive adhesive 41 and the amount of a warp of semiconductor chip 2. The horizontal axis indicates amount of warp w [μm] of semiconductor chip 2, and the vertical axis indicates length b [μm] of the base of a fillet formed by conductive adhesive 41 that has protruded. The thickness of semiconductor layer 40 is set to 53 [μm], semiconductor chips 2 having different amounts of a warp are manufactured by adjusting the thickness of metal layer 30, and a length of the base of the fillet of conductive adhesive 41 is plotted for each amount of the warp.

Circles on the graph show a relation between length b of the base of the fillet of conductive adhesive 41 and amount of warp w of semiconductor chip 2 when the amount of push on conductive adhesive 41 is 5 [μm], and b and w are in a relation of b=−0.75×w+135.3. Moreover, squares on the graph show a relation between length b of the base of the fillet of conductive adhesive 41 and amount of warp w of semiconductor chip 2 when the amount of push on conductive adhesive 41 is 10 [μm], and b and w are in a relation of b=−1.5×w+270.6.

The amount of push on conductive adhesive 41 refers to an amount by which semiconductor chip 2 is further pushed toward thick metal plate 42 after the entire surface on the back face side of metal layer 30 is evenly covered with conductive adhesive 41 to ensure the adhesiveness of metal layer 30 and conductive adhesive 41 at the time of bonding in step 505.

Since the amount of protrusion of conductive adhesive 41 is expressed by S×p [μm³], where the area of semiconductor layer 40 in the plan view is denoted by S [μm²], and the amount of push on conductive adhesive 41 is denoted by P [μm], the amount of the protrusion of conductive adhesive 41 increases with an increase in the amount of the push on conductive adhesive 41. In order to reduce the amount of the protrusion of conductive adhesive 41 as much as possible and stably ensure the adhesiveness of metal layer 30 and conductive adhesive 41, the amount of the push on conductive adhesive 41 may be in a range from 5 [μm] to 10 [μm].

In semiconductor device 1 according to Embodiment 1, in order for thick metal plate 42 to encompass the protruded portion of conductive adhesive 41 in the plan view, a margin may be provided as much as the length of the base of the fillet of conductive adhesive 41 when the amount of the push on conductive adhesive 41 is in the range from 5 [μm] to 10 [μm]. Accordingly, −0.75×w+135.3 (the plot line indicated by the circles)≤M≤−1.5×w+270.6 (the plot line indicated by the squares) may be satisfied, where a shortest distance from the outer periphery of semiconductor layer 40 to the outer periphery of thick metal plate 42 in the plan view is denoted by M [μm], and the area of thick metal plate 42 need not be increased in excess of this range. By adjusting the direction of the warp of semiconductor chip 2 and amount of warp w, it is possible to decrease the area of thick metal plate 42.

It should be noted that shortest distance M from the outer periphery of semiconductor layer 40 to the outer periphery of thick metal plate 42 in the plan view refers to the margin stated in the description of step 504. In other words, as an example, M refers to the shortest distance among margins each having a substantially equal width that are provided from the outer periphery of metal layer 30 to the outer periphery of thick metal plate 42 closest to metal layer 30 in the plan view.

However, the results of the consideration by the inventors show that when the amount of the warp of semiconductor chip 2 at 170[° C.] exceeds 30 [μm], the physical adhesiveness of metal layer 30 and conductive adhesive 41 deteriorates in the outer periphery of semiconductor chip 2, and conductive adhesive 41 may come off metal layer 30.

Figure 8A:
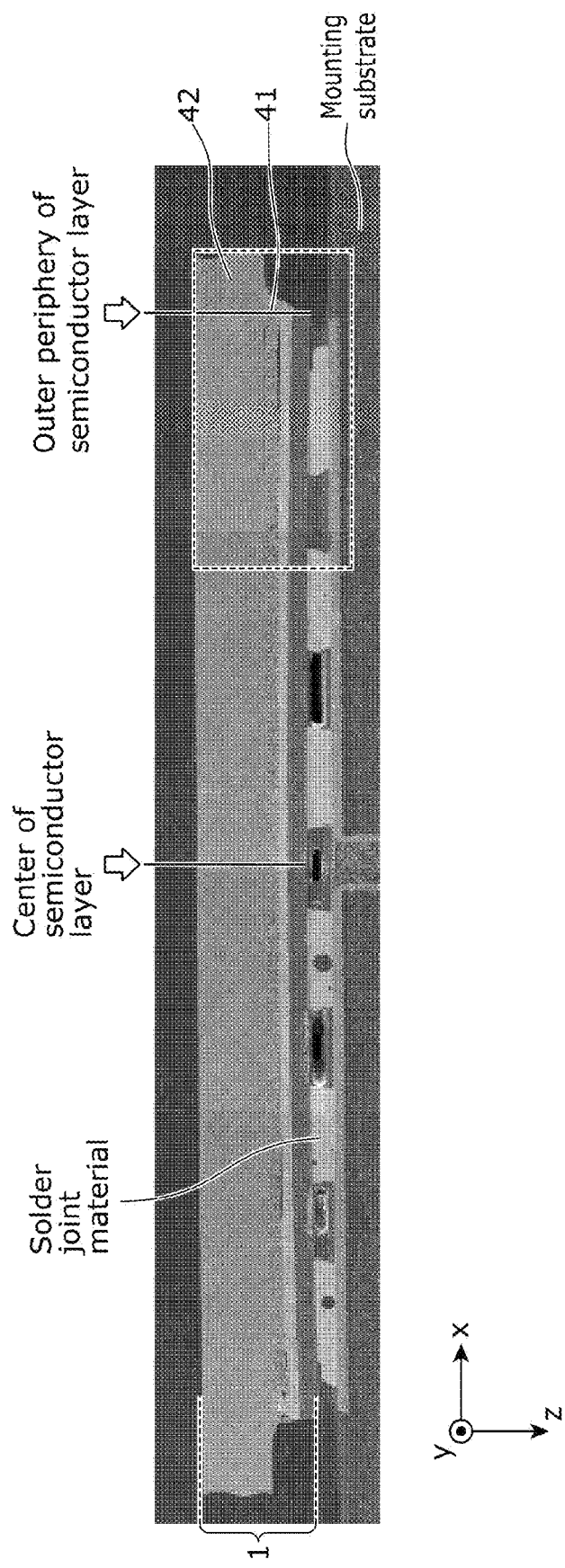
FIG. 8A is a cross-sectional SEM image showing an example of a structure of a semiconductor device according to Comparative Example 2 for Embodiment 1.
Figure 8B:
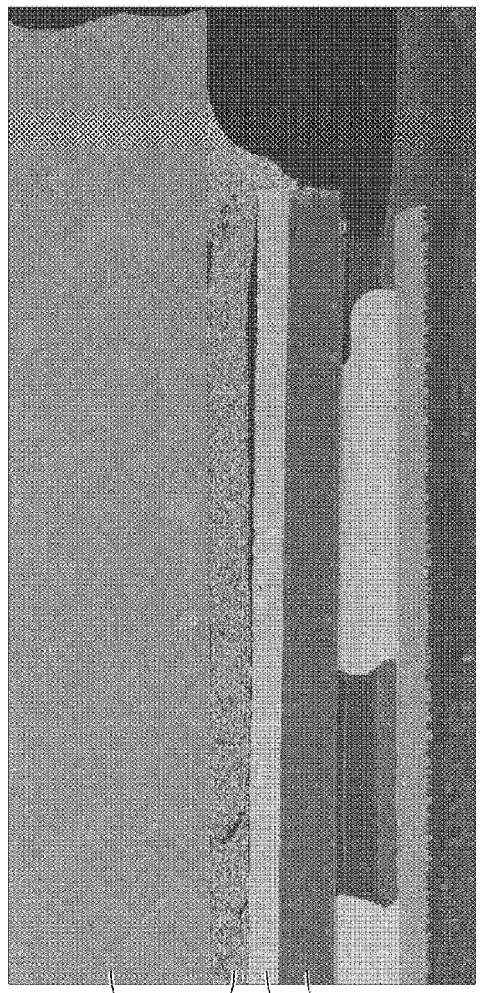
FIG. 8B is a cross-sectional SEM image showing an example of the structure of the semiconductor device according to Comparative Example 2 for Embodiment 1.

FIG. 8A and FIG. 8B each show a cross-sectional SEM image in Comparative Example 2 for Embodiment 1. FIG. 8B is an enlarged cross-sectional SEM image of the portion surrounded by the dashed line in FIG. 8A. In semiconductor device 1 shown in FIG. 8A and FIG. 8B, the thickness of semiconductor layer 40 is 40 [μm], the thicknesses of first source electrode 11 and second source electrode 21 are 4 [μm], the thickness of metal layer 30 is 25 [μm], and the thickness of thick metal plate 42 is 200 [μm]. In this thickness configuration, semiconductor chip 2 is in a warped shape that projects in the direction toward thick metal layer 42 (−Z direction), and the amount of the warp is 35 [μm].

As shown in FIG. 8B, it is clear that when the amount of the warp of semiconductor chip 2 is 35 [μm], a space occurs between metal layer 30 and conductive adhesive 41 in the outer periphery of semiconductor chip 2, and metal layer 30 and conductive adhesive 41 do not adhere to each other. When the amount of the warp is too large as above, there are concerns regarding conductive adhesive 41 coming off in the vicinity of the outer periphery of metal layer 30 in the plan view. Accordingly, in order to reduce the amount of the protrusion of conductive adhesive 41 while stably ensuring the bonding adhesiveness of metal layer 30 and thick metal plate 42, the amount of the warp of semiconductor chip 2 at 170[° C.] may be at most 30 [μm].

A direction of a warp (also referred to as a direction of a curvature) and the amount of the warp (also referred to as the amount of the curvature) of semiconductor chip 2 at high temperatures are determined by a relation between (i) a physical property value such as a coefficient of linear expansion or a Young's modulus of each of semiconductor layer 40, first source electrode 11, second source electrode 21, and metal layer 30 and (ii) the thickness of each of semiconductor layer 40, first source electrode 11, second source electrode 21, and metal layer 30.

Since a coefficient of linear expansion of a metal type included in first source electrode 11 and second source electrode 21 and a coefficient of linear expansion of a metal type included in metal layer 30 are often approximate values, the direction of the warp of semiconductor chip 2 is often determined only by a relation between the thickness of metal layer 30 and the thicknesses of first source electrode 11 and second source electrode 21.

Since the thickness of first source electrode 11 and the thickness of second source electrode 21 are typically at least 2 [μm] and at most 8 [μm], in order to control a warp that projects in the −Z direction, the thickness of metal layer 30 may be set to at least 10 [μm]. This is because, by causing the thickness of metal layer 30 to be greater than the thickness of first source electrode 11 and the thickness of second source electrode 21, a greater thermal stress occurs in metal layer 30 at high temperatures, and semiconductor chip 2 is caused to be in a curved shape that projects in a direction in which metal layer 30 is included (−Z direction).

It should be noted that the amount of a warp is determined by a relative relation between the thickness of semiconductor layer 40 and the thickness of metal layer 30, and increases with a decrease in the thickness of semiconductor layer 40 or an increase in the thickness of metal layer 30. Accordingly, by adjusting the thicknesses of semiconductor layer 40 and metal layer 30, it is possible to control the amount of the warp of semiconductor chip 2 at 170[° C.] to be at most 30 [μm].

In semiconductor device 1 according to Embodiment 1, when the amount of conductive adhesive 41 applied to the front face of thick metal plate 42 and the amount of push on conductive adhesive 41 are constant, and the bonding adhesiveness of metal layer 30 and thick metal plate 42 via conductive adhesive 41 is stably ensured, a volume by which conductive adhesive 41 protrudes from semiconductor chip 2 (the volume of the fillet of conductive adhesive 41) becomes constant. The height of the fillet of conductive adhesive 41 (an amount by which conductive adhesive 41 rises from the front face of thick metal plate 42 along the lateral faces of semiconductor chip 2) varies depending on the length of the base of the fillet of conductive adhesive 41 while the volume of the fillet of conductive adhesive 41 is constant.

Next, the following describes (2).

In semiconductor device 1 according to Embodiment 1, an amount by which conductive adhesive 41 protrudes from semiconductor chip 2 is expressed by L1×L2×p [μm³], where the length of a longer side of semiconductor layer 40 and the length of a shorter side of semiconductor layer 40 in the plan view are denoted by L1 [μm] and L2 [μm], respectively (when semiconductor layer 40 is square, L1=L2). Moreover, since conductive adhesive 41 that has protruded from semiconductor chip 2 forms a fillet in a substantially triangular shape in the cross-sectional view, the volume of the fillet of conductive adhesive 41 is expressed by (b×ht/2)×2×(L1+L2) [μm³], where the height of the fillet of conductive adhesive 41 is denoted by ht [μm]. However, the protrusion amount of conductive adhesive 41 is assumed to be uniform along the outer periphery of semiconductor layer 40 in the plan view.

Since the amount by which conductive adhesive 41 protrudes from semiconductor chip 2 expressed by L1×L2×p [μm³] is equal to the volume of the fillet of conductive adhesive 41 expressed by (b×ht/2)×2×(L1+L2) [μm³], the height of the fillet of conductive adhesive 41 is expressed by ht=P×L1×L2/{b×(L1+L2)}. It should be noted that it is assumed that the amount of the warp of semiconductor chip 2 is at most 30 [μm], and conductive adhesive 41 does not come off between metal layer 30 and thick metal plate 42.

Since semiconductor device 1 is likely to short-circuit when conductive adhesive 41 rises to the top face of semiconductor chip 2, an amount by which conductive adhesive 41 rises from the front face of thick metal plate 42 along the lateral faces of semiconductor chip 2 (the height of the fillet of conductive adhesive 41) needs to be less than the top face of semiconductor layer 40.

In semiconductor device 1 according to Embodiment 1, semiconductor chip 2 is controlled to project in the direction toward support 42 (−Z direction), and the outer periphery of semiconductor chip 2 curves in the direction relatively away from support 42 (+Z direction) due to the warp. Since a distance from the front face of thick metal plate 42 to the top face of semiconductor chip 2 is increased in the outer periphery of semiconductor chip 2 in the plan view when semiconductor chip 2 is in such a curved shape, it is possible to achieve the effect of preventing conductive adhesive 41 that has protruded from semiconductor chip 2 from rising to the top face of semiconductor chip 2.

In semiconductor device 1 according to Embodiment 1, when ht<H+T+w is satisfied, where the thickness of semiconductor chip 2 and the thickness of conductive adhesive 41 at the center of semiconductor chip 2 in the plan view are denoted by H [μm] and T [μm], respectively, conductive adhesive 41 does not rise to the top face of semiconductor layer 40.

In other words, by controlling the direction and the amount of the warp of semiconductor chip 2, it is possible to reduce the length of conductive adhesive 41 that is to protrude from semiconductor chip 2 in the plan view, and to prevent conductive adhesive 41 that has protruded from semiconductor chip 2 in the cross-sectional view from rising to the top face of semiconductor chip 2.

Figure 9:
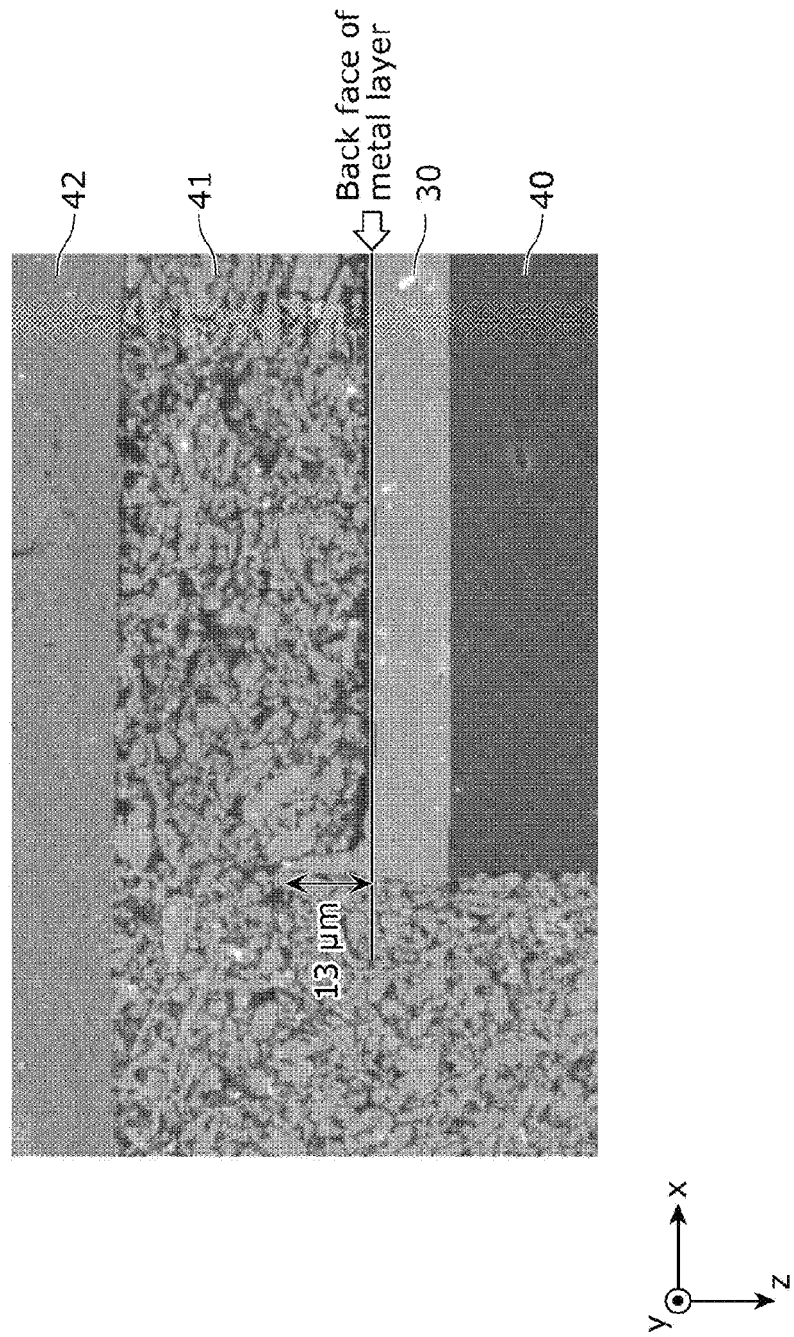
FIG. 9 is a cross-sectional SEM image showing an example of the structure of the semiconductor device according to Embodiment 1.

FIG. 9 is a cross-sectional SEM image of the outer periphery of semiconductor device 1 according to Embodiment 1. As shown in FIG. 9, metal layer 30 may include a projection on a surface of metal layer 30 to which conductive adhesive 41 is bonded, in the direction toward thick metal plate 42 (−Z direction). As an example, this projection is a burr formed by physically pushing and extending metal layer 30 when semiconductor chip 2 in a wafer state is diced using a blade, and if that is the case, the burr is often continuously formed along the outer periphery of metal layer 30 in the plan view.

In semiconductor device 1 according to Embodiment 1, when a portion in which the burr has a height of at least 5 [μm] from the back face of metal layer 30 is partially included in the outer periphery of semiconductor chip 2, such a portion serves as an anchor for the bonding of metal layer 30 and conductive adhesive 41, and achieves the effect of improving the adhesiveness to conductive adhesive 41.

The results of further consideration by the inventors show that, in the adhesiveness of metal layer 30 and conductive adhesive 41, the surface of metal layer 30 bonded to conductive adhesive 41 may contain a metal type other than nickel (Ni), and when the surface of metal layer 30 typically contains silver (Ag) or copper (Cu) as a main material, it is possible to stably ensure the bonding adhesiveness of metal layer 30 and conductive adhesive 41.

The following describes variations of semiconductor device 1 according to Embodiment 1.

Figure 10A:
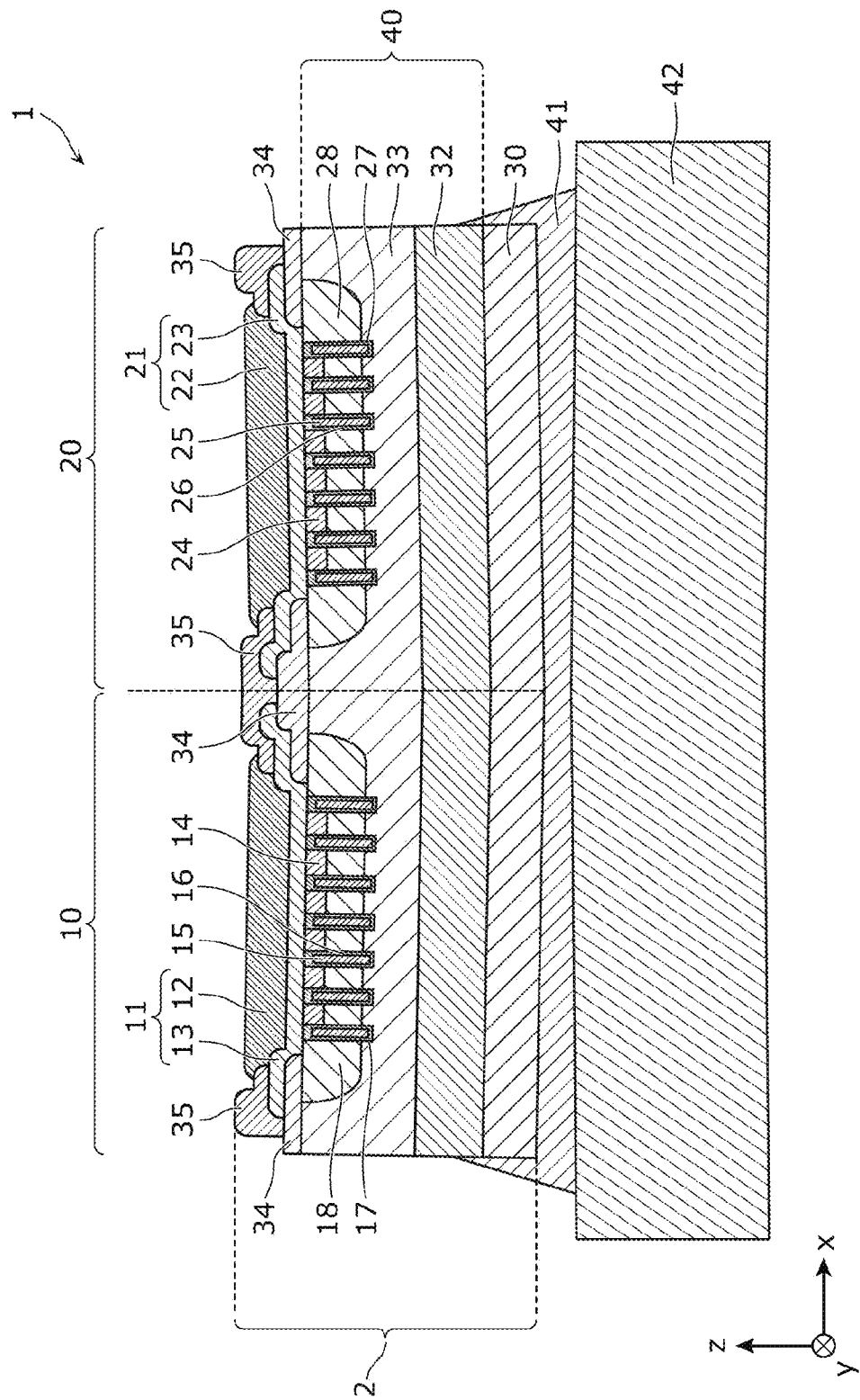
FIG. 10A is a schematic cross-sectional view illustrating an example of a structure of a semiconductor device according to Variation 1 of Embodiment 1.

FIG. 10A is a schematic cross-sectional view illustrating Variation 1 of semiconductor device 1 according to Embodiment 1. In semiconductor device 1 according to Variation 1, support 42 is in a curved shape that projects in a direction toward semiconductor chip 2. The curved shape of support 42 refers to, for example, a shape that results from a warp of support 42 at the time of heat treatment when metal layer 30 and support 42 are bonded via conductive adhesive 41. The amount of a warp of support 42 is a difference between the highest position and the lowest position in the Z direction in a top face or a bottom face of support 42 in a cross-sectional view of support 42. When a warp that occurs in support 42 is a warp that projects in the direction toward semiconductor chip 2, the highest position is the center of support 42 in the plan view, and the lowest position is the outer periphery of support 42, especially corner portions located in the outer periphery, in the plan view.

By adjusting one or more of the following: the amount of a warp of semiconductor chip 2 that occurs at 170[° C.], at least one of the thickness or the material of support 42, at least one of the thickness or the material of conductive adhesive 41, and bonding conditions, it is possible to control the direction of a warp or the amount of a warp of support 42. The easiest adjustment method is thinning down support 42. When support 42 is thinned down, it is possible to increase the amount of a warp of support 42 at the completion of semiconductor device 1, but rigidity as semiconductor device 1 is decreased. For this reason, as a guideline, the thickness of support 42 may be designed to cause the amount of a warp of support 42 to be smaller than the amount of a warp of semiconductor chip 2.

As shown in FIG. 10A, in semiconductor device 1, since a push on conductive adhesive 41 is reduced when the amount of curvature of support 42 is smaller than the amount of curvature of semiconductor chip 2, and support 42 is in the curved shape that projects in the direction toward semiconductor chip 2, compared to a case in which support 42 is not in the curved shape, it is possible to reduce a protruding length of conductive adhesive 41 from semiconductor layer 40 in the plan view.

FIG. 10B is a schematic cross-sectional view illustrating Variation 2 of semiconductor device 1 according to Embodiment 1. In semiconductor device 1 according to Variation 2, support 42 is in a curved shape that projects in a direction away from semiconductor chip 2. As shown in FIG. 10B, in semiconductor device 1, when the amount of curvature of support 42 is smaller than the amount of curvature of semiconductor chip 2, and support 42 is in the curved shape that projects in the direction away from semiconductor chip 2, it is possible to prevent one or more voids from occurring between semiconductor chip 2 and conductive adhesive 41 in the vicinity of the center of semiconductor layer 40 in the plan view, compared to a case in which support 42 is not in the curved shape.

Embodiment 2

Hereinafter, semiconductor device 100 according to Embodiment 2 obtained by changing part of the configuration of semiconductor device 1 according to Embodiment 1 is described.

In semiconductor device 100 according to Embodiment 2, support 42 that is the thick metal plate in Embodiment 1 is replaced with insulating support 420.

Here, constituent elements of semiconductor device 100 according to Embodiment 2 that are common to semiconductor device 1 according to Embodiment 1 are given the same reference signs, and the detailed description thereof is omitted, as they have already been described. The following description focuses mainly on differences from semiconductor device 1.

[1. Configuration of Semiconductor Device]

Figure 11:
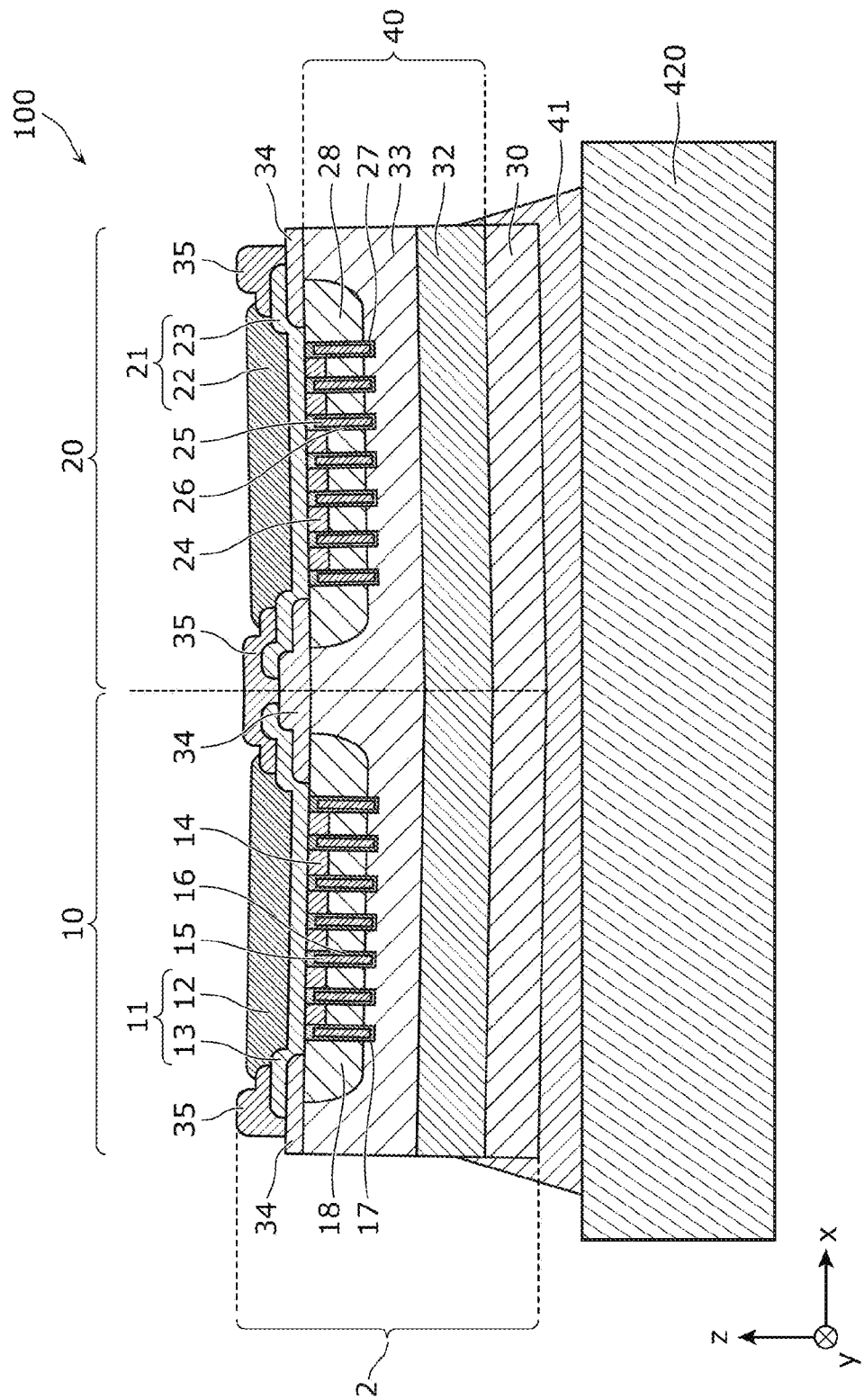
FIG. 11 is a schematic cross-sectional view illustrating an example of a structure of a semiconductor device according to Embodiment 2.

FIG. 11 is a schematic cross-sectional view of semiconductor device 100 according to Embodiment 2. Semiconductor device 100 differs from semiconductor device 1 according to Embodiment 1 in that support 42 is replaced with insulating support 420.

[2. Method for Manufacturing Semiconductor Device]

FIG. 12 shows parts of a manufacturing process for semiconductor device 100 according to Embodiment 2 in a simplified manner. Steps 501 to 504 are the same as those of the manufacturing process for semiconductor device 1 according to Embodiment 1. Step 506 is equivalent to step 505 in Embodiment 1.

In Embodiment 2, semiconductor chip 2 is bonded to insulating support 420 in step 506. Conductive adhesive 41 is applied to a top face of insulating support 420 in advance in step 506. Conductive adhesive 41 is, for example, silver paste, cures by being heated to 170[° C.], and bonds semiconductor chip 2 and insulating support 420.

[3. Discussion]

Since insulating support 420 is used in semiconductor device 100 according to the present embodiment, it is possible to increase rigidity more than the thick metal plate according to Embodiment 1 does. Examples of a material having a favorable rigidity include a silicon substrate. When a silicon substrate is used as insulating support 420, it is possible to achieve the same effects as the effects achieved by using the thick metal plate in semiconductor device 1 according to Embodiment 1 with thinner sizes.

Moreover, since the semiconductor device according to the present disclosure includes metal layer 30, it is possible to achieve a sufficiently low on resistance using metal layer 30 as a conductive pathway. Accordingly, semiconductor device 100 according to Embodiment 2 becomes effective when semiconductor chip 2 includes metal layer 30 on the back face side of semiconductor layer 40.

As with semiconductor device 1 according to Embodiment 1, since metal layer 30 is located in semiconductor chip 2, semiconductor device 100 according to Embodiment 2 also makes it possible to cause a warp that occurs in semiconductor chip 2 at 170[° C.] to project in a direction toward support 42.

Although the semiconductor device according to one aspect of the present disclosure has been thus far described based on each of Embodiments 1 and 2 and Variations 1 and 2, the present disclosure is not limited to these embodiments and variations. Forms obtained by making various modifications conceived by a person skilled in the art to the embodiments or forms obtained by combining constituent elements in different embodiments and variations may be included in in the scope of one or more aspects of the present disclosure, as long as they do not depart from the essences of the present disclosure.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The semiconductor device including the vertical MOS transistor according to the present disclosure can be widely used as a device that controls the conducting state of a current pathway.

The invention claimed is:

1. A semiconductor device that is a facedown mountable semiconductor device, the semiconductor device comprising:
a semiconductor substrate;
a low-concentration impurity layer that is provided on a front face side of the semiconductor substrate;
a first vertical metal-oxide semiconductor (MOS) transistor that is provided in a first region of a semiconductor layer that is a combination of the semiconductor substrate and the low-concentration impurity layer;

a second vertical MOS transistor that is provided in a second region adjacent to the first region in a plan view of the semiconductor layer;

a metal layer that is connected to and in contact with an entire surface on a back face side of the semiconductor substrate; and a support that is bonded to a back face side of the metal layer via an adhesive, wherein in the plan view, the support is larger in area than the semiconductor layer and encompasses the semiconductor layer, a thickness of the support is greater than a thickness of the semiconductor layer, in a cross-sectional view of the semiconductor device that includes a center of the semiconductor layer and an outer periphery of the semiconductor layer in the plan view, a height of the adhesive along a lateral face of the semiconductor layer does not reach a top face of the semiconductor layer, when a semiconductor chip of the semiconductor device excluding the support and the adhesive is seen in the cross-sectional view, the semiconductor chip is in a curved shape that is convex in a direction toward the support, wherein $-0.75 \times w + 135.3 \leq M \leq -1.5 \times w + 270.6$ is satisfied, where an amount of curvature of the semiconductor chip is denoted by $w$ μm and a shortest distance from the outer periphery of the semiconductor layer to an outer periphery of the support in the plan view is denoted by $M$ μm.

2. The semiconductor device according to claim 1, wherein in the plan view, the semiconductor layer is in a rectangular shape, and a thickness of the adhesive immediately below the semiconductor layer in the outer periphery of the semiconductor layer in the plan view is greater than a thickness of the adhesive immediately below the semiconductor layer at the center of the semiconductor layer in the plan view.

3. The semiconductor device according to claim 1, wherein $P \times L1 \times L2 / \{b \times (L1+L2)\} < H+T+w$ is satisfied, where 5 μm $\leq P \leq$ 10 μm; in the plan view, a length of a side of the semiconductor layer in a first direction is denoted by $L1$ μm, a length of a side of the semiconductor layer in a second direction orthogonal to the first direction is denoted by $L2$ μm, and a protruding length of the adhesive from the outer periphery of the semiconductor chip is denoted by $b$ μm; and in the plan view, a thickness of the semiconductor chip and a thickness of the adhesive at the center of the semiconductor chip are denoted by $H$ μm and $T$ μm, respectively.

4. The semiconductor device according to claim 1, wherein in the cross-sectional view, the support is in a curved shape that is convex in a direction toward the semiconductor chip, and an amount of curvature of the support is smaller than an amount of curvature of the semiconductor chip.

5. The semiconductor device according to claim 1, wherein in the cross-sectional view, the support is in a curved shape that is convex in a direction away from the semiconductor chip, and an amount of curvature of the support is smaller than an amount of curvature of the semiconductor chip.

6. The semiconductor device according to claim 1, further comprising:

a protrusion that is located in an outer periphery of the metal layer and protrudes toward the adhesive in the plan view, wherein in a cross-sectional view of the protrusion, the protrusion includes a portion that has a height of at least 5 μm.

7. The semiconductor device according to claim 1, wherein the metal layer is of a multilayer configuration, and a face of the metal layer to which the adhesive is applied includes no nickel.

8. The semiconductor device according to claim 1, wherein the adhesive is a conductive adhesive that contains a conductive particle, and includes a resin that thermally cures at 200° C. or less.

9. The semiconductor device according to claim 1, wherein the support includes a metal, and the support has a conductivity equal to a conductivity of the metal layer.

* * * * *